(12) United States Patent
Fischer et al.

(10) Patent No.: US 9,035,416 B2
(45) Date of Patent: May 19, 2015

(54) EFFICIENT PITCH MULTIPLICATION PROCESS

(71) Applicant: MICRON TECHNOLOGY, INC., Boise, ID (US)

(72) Inventors: Mark Fischer, Boise, ID (US); Stephen Russell, Boise, ID (US); H.Montgomery Manning, Eagle, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 22 days.

(21) Appl. No.: 13/902,675

(22) Filed: May 24, 2013

(65) Prior Publication Data

US 2013/0256827 A1    Oct. 3, 2013

Related U.S. Application Data

(60) Division of application No. 13/198,581, filed on Aug. 4, 2011, now Pat. No. 8,450,829, which is a division of application No. 12/687,005, filed on Jan. 13, 2010, now Pat. No. 8,012,674, which is a continuation of application No. 11/521,851, filed on Sep. 14, 2006, now Pat. No. 7,666,578.

(51) Int. Cl.
*H01L 29/06* (2006.01)
*H01L 21/033* (2006.01)
*H01L 21/308* (2006.01)

(52) U.S. Cl.
CPC ............ *H01L 29/06* (2013.01); *H01L 21/0338* (2013.01); *H01L 21/3088* (2013.01)

(58) Field of Classification Search
USPC .......................... 257/499, 314, 734, 216, 368
See application file for complete search history.

(56) References Cited

U.S. PATENT DOCUMENTS

| 4,234,362 | A | 11/1980 | Riseman |
| 4,419,809 | A | 12/1983 | Riseman et al. |

(Continued)

FOREIGN PATENT DOCUMENTS

| DE | 42 36 609 | 5/1994 |
| EP | 0227303 | 7/1987 |

(Continued)

OTHER PUBLICATIONS

Office Action dated Apr. 7, 2014 in corresponding Korean Patent Application No. 10-2009-7007602.

(Continued)

*Primary Examiner* — Whitney T Moore
*Assistant Examiner* — Rodolfo Fortich
(74) *Attorney, Agent, or Firm* — Knobbe, Martens, Olson & Bear LLP

(57) ABSTRACT

Pitch multiplied and non-pitch multiplied features of an integrated circuit, e.g., features in the array, interface and periphery areas of the integrated circuit, are formed by processing a substrate through a mask. A photoresist layer is patterned to simultaneously define mask elements in the array, interface and periphery areas. The pattern is transferred to an amorphous carbon layer. Spacers are formed on the sidewalls of the patterned amorphous carbon layer. Protective material is deposited and patterned to expose mask elements in the array region and in parts of the interface or periphery areas. Exposed amorphous carbon is removed, leaving free-standing spacers in the array region. The protective material is removed, leaving a pattern of pitch multiplied spacers in the array region and non-pitch multiplied mask elements in the interface and periphery areas. The pattern is transferred to a hard mask layer, through which the substrate is etched.

20 Claims, 23 Drawing Sheets

(56) References Cited

U.S. PATENT DOCUMENTS

| | | |
|---|---|---|
| 4,432,132 A | 2/1984 | Kinsbron et al. |
| 4,502,914 A | 3/1985 | Trumpp et al. |
| 4,508,579 A | 4/1985 | Goth et al. |
| 4,648,937 A | 3/1987 | Ogura et al. |
| 4,716,131 A | 12/1987 | Okazawa et al. |
| 4,776,922 A | 10/1988 | Bhattacharyya et al. |
| 4,803,181 A | 2/1989 | Buchmann et al. |
| 4,838,991 A | 6/1989 | Cote et al. |
| 5,013,680 A | 5/1991 | Lowrey et al. |
| 5,047,117 A | 9/1991 | Roberts |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,858,620 A | 1/1999 | Ishibashi et al. |
| 5,895,740 A | 4/1999 | Chien et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 * | 3/2002 | Taylor et al. ............ 438/286 |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,115,525 B2 | 10/2006 | Abatchev et al. |
| 7,183,142 B2 | 2/2007 | Anderson et al. |
| 7,183,205 B2 | 2/2007 | Hong |
| 7,183,597 B2 | 2/2007 | Doyle |
| 7,202,174 B1 | 4/2007 | Jung et al. |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,378,727 B2 | 5/2008 | Caspary et al. |
| 7,442,976 B2 | 10/2008 | Juengling |
| 7,537,866 B2 | 5/2009 | Liu |
| 7,666,578 B2 | 2/2010 | Fischer et al. |
| 7,851,135 B2 | 12/2010 | Jung et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou et al. |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht et al. |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 * | 10/2006 | Lee et al. .............. 257/368 |
| 2006/0263699 A1 | 11/2006 | Abatchev et al. |
| 2006/0267075 A1 | 11/2006 | Sandhu et al. |
| 2006/0273456 A1 * | 12/2006 | Sant et al. .............. 257/734 |
| 2006/0281266 A1 | 12/2006 | Wells |
| 2007/0026672 A1 | 2/2007 | Tang et al. |
| 2007/0045712 A1 | 3/2007 | Haller et al. |

(56) References Cited

U.S. PATENT DOCUMENTS

| | | |
|---|---|---|
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0148968 A1 | 6/2007 | Kwon et al. |
| 2007/0205438 A1 | 9/2007 | Juengling |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0238308 A1 | 10/2007 | Niroomand et al. |
| 2007/0249170 A1 | 10/2007 | Kewley |
| 2007/0261016 A1 | 11/2007 | Sandhu et al. |
| 2007/0275309 A1 | 11/2007 | Liu |
| 2007/0281219 A1 | 12/2007 | Sandhu |
| 2008/0054350 A1 | 3/2008 | Breitwisch et al. |
| 2008/0057692 A1 | 3/2008 | Wells et al. |
| 2008/0292991 A1 | 11/2008 | Wallow |

FOREIGN PATENT DOCUMENTS

| | | |
|---|---|---|
| EP | 0491408 | 6/1992 |
| EP | 1357433 | 10/2003 |
| JP | 57-048237 | 3/1982 |
| JP | 64-035916 | 2/1989 |
| JP | 02-005522 | 1/1990 |
| JP | 03-257825 | 11/1991 |
| JP | 05-343370 | 12/1993 |
| JP | H8-55908 | 2/1996 |
| JP | H8-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-019496 | 1/2006 |
| JP | 2006-351861 | 1/2012 |
| KR | 10-1995-0034748 A | 12/1995 |
| KR | 10-0122315 B1 | 9/1997 |
| KR | 10-1999-001440 | 1/1999 |
| KR | 10-1999-027887 | 4/1999 |
| KR | 10-2003-0096563 | 12/2003 |
| KR | 10-2005-0052213 | 6/2005 |
| WO | WO 94/15261 | 7/1994 |
| WO | WO 02/099864 A1 | 12/2002 |
| WO | WO 2004/001799 A2 | 12/2003 |
| WO | WO 2004/003977 A2 | 1/2004 |
| WO | WO 2005/034215 A1 | 4/2005 |
| WO | WO 2006/026699 | 3/2006 |

OTHER PUBLICATIONS

Bergeron, et al., "Resolution Enhancement Techniques for the 90nm Technology Node and Beyond," Future Fab International, Issue 15, Jul. 11, 2003, 4 pages.

Bhave et al., "Developer-soluble Gap fill materials for patterning metal trenches in via-first Dual Damascene process," preprint of Proceedings of SPIE: Advances in Resist Technology and Processing XXI, vol. 5376, John L. Sturtevant, editor, 2004, 8 pages.

Bruek, S.R.J., "Optical and interferometric lithography—Nanotechnology enablers," *Proceedings of the IEEE*, vol. 93, No. 10, Oct. 2005, pp. 1704-1721.

Cerofolini et al., "Strategies for nanoelectronics", *Microelectronic Engineering*, vol. 81, pp. 405-419 (2005).

Choi et al. "Sublithographic nanofabrication technology for nanocatalysts and NDA chips," *J. Vac. Sci. Technol*. pp. 2951-2955 (Nov./Dec. 2003).

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

U.S. Appl. No. 11/543,515, filed Oct. 24, 2006.

Ex Parte Cantell, unpublished decision of the Board of Patent Appeals and Interferences, Mar. 4, 2005.

Joubert et al., "Nanometer scale linewidth control during etching of polysilicon gates in high-density plasmas," Microelectronic Engineering 69 (2003), pp. 350-357.

Notice of Rejection Grounds dated Oct. 2, 2012 in corresponding Japanese Patent Application No. 2009-528390.

Oehrlein et al., "Pattern transfer into low dielectic materials by high-density plasma etching," Solid State Tech., May 2000, 8 pages.

Sheats et al., "Microlithography: Science and Technology," *Marcel Dekkar, Inc.*, pp. 104-105 (1998).

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

Notice of Preliminary Rejection (Non-Final) dated Oct. 29, 2013, along with its English translation, in corresponding Korean Patent Application No. 10-2009-7007602.

Notice of Rejection Grounds, and its English translation, dated Jul. 30, 2013 in corresponding Japanese Patent Application No. 2009-528390.

\* cited by examiner

EFFICIENT PITCH MULTIPLICATION PROCESS

REFERENCE TO RELATED APPLICATIONS

This application is a divisional of U.S. patent application Ser. No. 13/198,581 to Fischer et al., EFFICIENT PITCH MULTIPLICATION PROCESS, filed Aug. 4, 2011, which is a divisional of U.S. patent application Ser. No. 12/687,005 to Fischer et al., EFFICIENT PITCH MULTIPLICATION PROCESS, filed Jan. 13, 2010 (now U.S. Pat. No. 8,012,674), which is a continuation of U.S. patent application Ser. No. 11/521,851 to Fischer et al., EFFICIENT PITCH MULTIPLICATION PROCESS, filed Sep. 14, 2006 (now U.S. Pat. No. 7,666,578).

This application is related to the following: U.S. patent application Ser. No. 10/934,778 to Abatchev et al., Method for Integrated Circuit Fabrication Using Pitch Multiplication, filed Sep. 2, 2004; U.S. patent application Ser. No. 10/931,771 to Tran et al., Methods for Increased Photo Alignment Margins, filed Aug. 31, 2004; U.S. patent application Ser. No. 11/214,544 to Tran et al., Pitch Reduced Patterns Relative To Photolithography Features, filed Aug. 29, 2005; U.S. patent application Ser. No. 11/366,212 to Werner Juengling, Process Flow for Vertical Transistor Arrays, filed Mar. 2, 2006; and U.S. patent application Ser. No. 11/367,020 to Werner Juengling, Masking Process For Simultaneously Patterning Separate Regions, filed Mar. 2, 2006. The entireties of each of these references are incorporated by reference herein.

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. A DRAM memory cell typically consists of two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that constitute a memory cell and the sizes of the conducting lines that access the memory cells, the memory devices can be made smaller. Additionally, storage capacities can be increased by fitting more memory cells on a given area in the memory devices. Other memory designs can integrate access and storage devices or omit access devices (e.g., cross-point MRAM, PCRAM, etc.).

The continual reduction in feature sizes places ever greater demands on the techniques used to form the features. For example, photolithography is commonly used to pattern features, such as conductive lines. The concept of pitch can be used to describe the sizes of these features. Pitch is defined as the distance between an identical point in two neighboring features of a repeating pattern. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as optics and light or radiation wavelength, photolithography techniques each have a minimum pitch below which a particular photolithographic technique cannot reliably form features. Thus, the minimum pitch of a photolithographic technique is an obstacle to continued feature size reduction.

"Pitch doubling" or "pitch multiplication" is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60 (FIG. 1E), i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one mask element and one space, the same width now includes two mask elements and two spaces, with the spaces defined by, e.g., the spacers 60. As a result, the smallest feature size that can be formed with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

Because the layer 50 of spacer material typically has a single thickness 90 (see FIGS. 1D and 1E) and because the sizes of the mask elements formed by the spacers 60 usually correspond to that thickness 90, pitch doubling typically produces mask elements of only one width. Circuits, however, generally employ features of different sizes. For example, random access memory circuits typically contain arrays of memory cells located in one part of the circuits and logic circuits located in the so-called "periphery." In the arrays, the memory cells are typically connected by conductive lines and, in the periphery, the conductive lines typically contact interconnects in the periphery or landing pads for connecting arrays to logic. Peripheral features such as peripheral interconnects and landing pads, however, can be larger than the conductive lines in the array. In addition, electrical devices in the periphery, including peripheral transistors, can be larger than the electrical devices in the array. Moreover, even if peripheral features can be formed with the same pitch as features in the array, because mask patterns formed by pitch multiplication may be limited to those that are formed along the sidewalls of patterned photoresist, it is challenging to employ pitch multiplication while achieving the flexibility, e.g., geometric flexibility, required to define some features.

Accordingly, there is a need for methods of forming features of different sizes, especially where some features are formed below the minimum pitch of a photolithographic technique, and especially in conjunction with pitch multiplication.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1A:
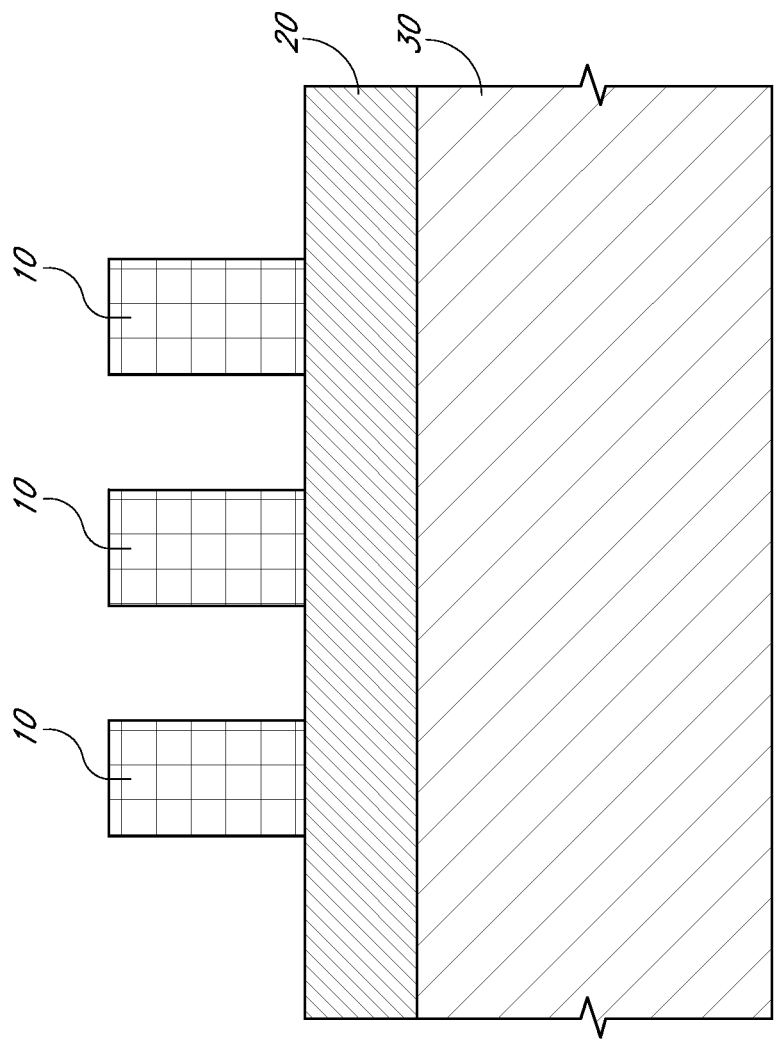
FIGS. 1A-1F are schematic, cross-sectional side views of a sequence of masking patterns for forming conductive lines, in accordance with a prior art pitch doubling method.
Figure 1B:
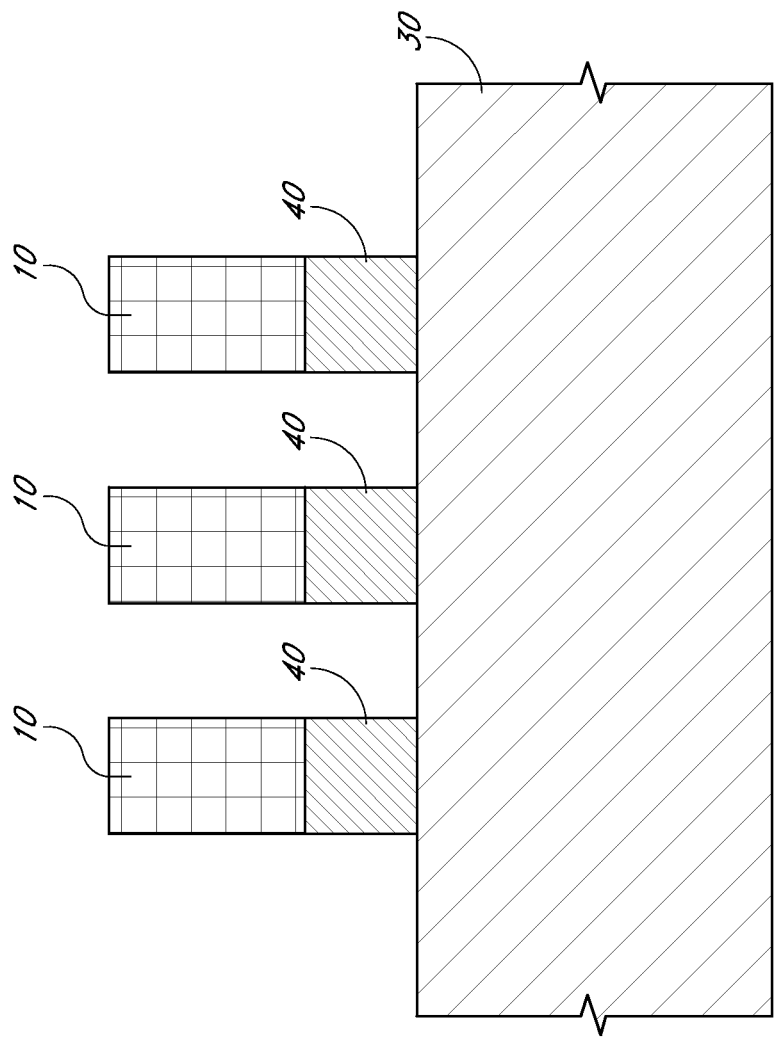
Figure 1C:
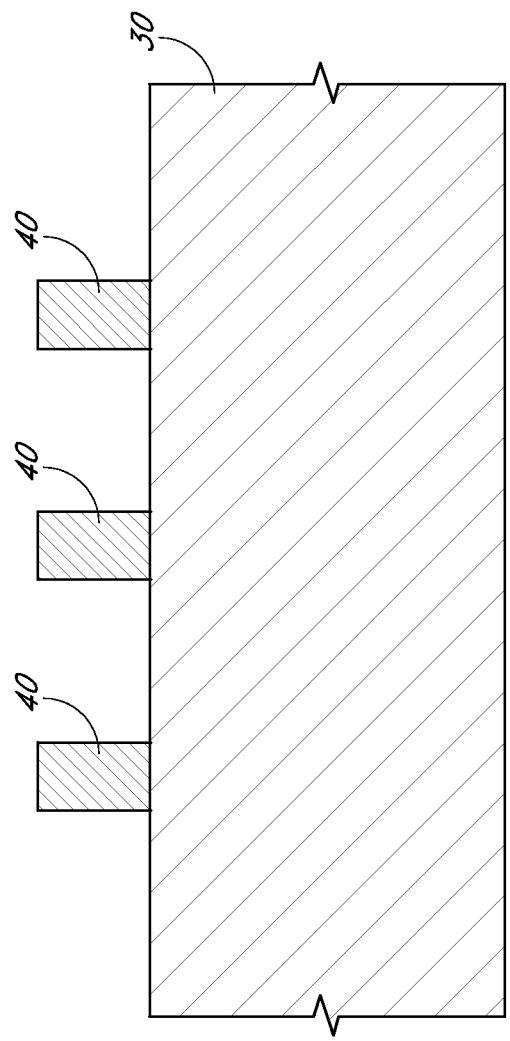
Figure 1D:
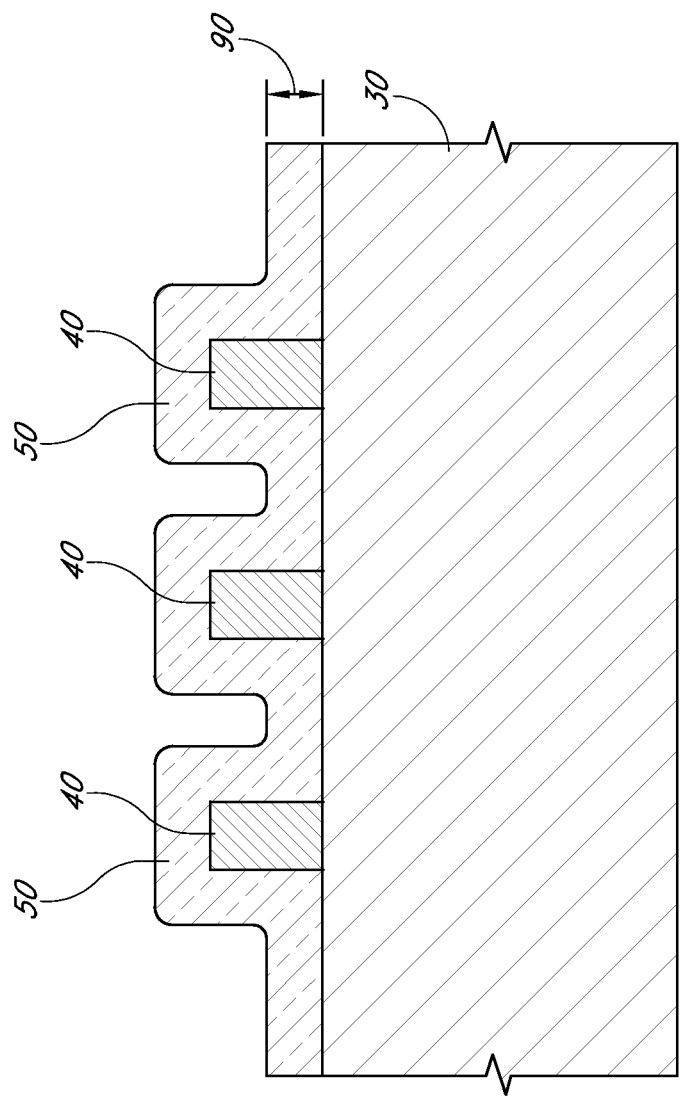
Figure 1E:
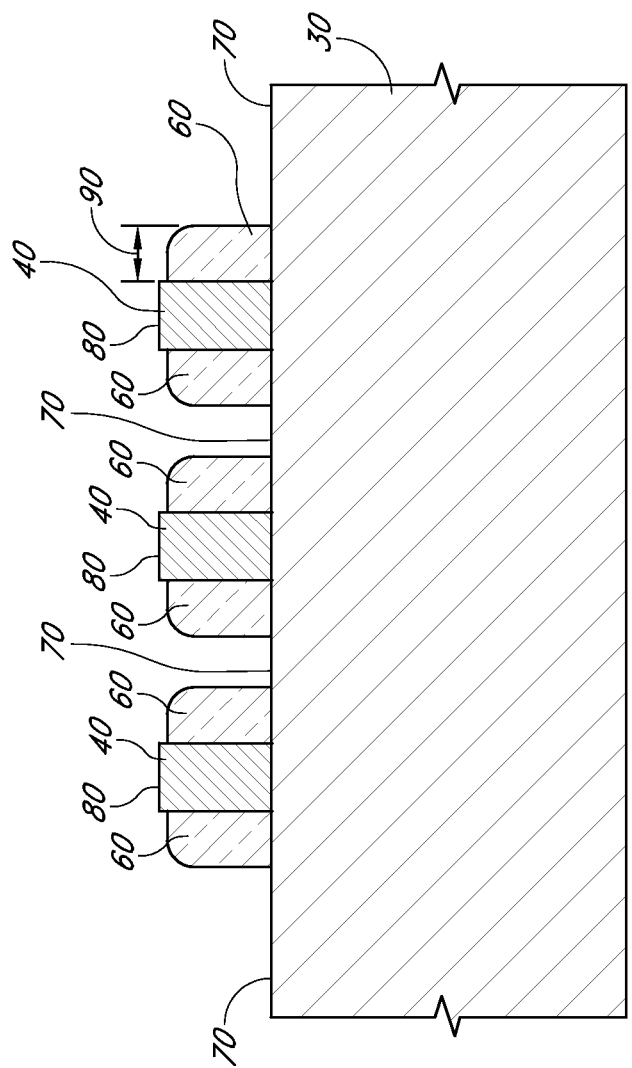
Figure 1F:
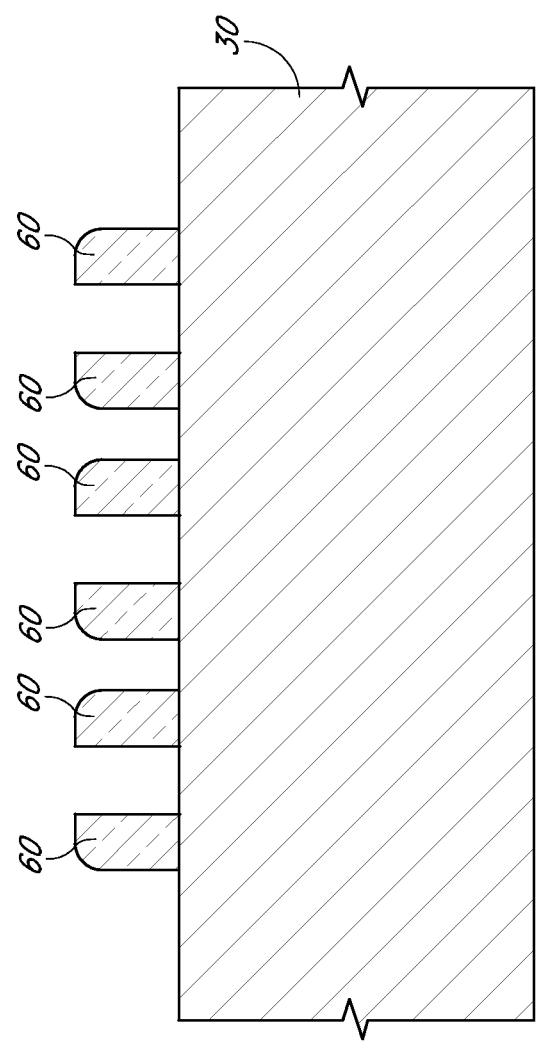

Because of the difference in size between pitch multiplied features and larger features such as non-pitch multiplied features, connecting pitch multiplied features to the larger features can be difficult. For example, the pitch multiplied features are typically too small and/or closely spaced to reliably contact features such as contact plugs or larger sized interconnects. Shorting or other misalignments can occur because of the small size and/or close spacing of the pitch multiplied features. Various strategies have been proposed for forming pitch multiplied and non-pitch multiplied features. Exemplary methods for forming pitch multiplied and non-pitch multiplied features are described in U.S. patent application Ser. No. 10/934,778 to Abatchev et al. and U.S. patent application Ser. No. 10/931,771 to Tran et al., both of which are assigned to the assignee of the present application. The entire disclosures of each of these references are incorporated by reference herein.

In addition to difficulties with forming and connecting pitch multiplied and non-pitch multiplied features, the process flows can be complicated, due to the need to form and overlay features of different sizes. For example, the pitch multiplied features can be formed separately from the larger sized features, thereby requiring multiple mask formation and mask consolidation steps. It will be appreciated that each additional step in a process flow can undesirably add to the complexity and expense of a process flow. Moreover, each additional step has the possibility of introducing misalignments and etch and pattern transfer complications and other errors which can cause undesirable variations in process results.

In view of these difficulties, preferred embodiments of the invention allow for the formation and connection of pitch multiplied and non-pitch multiplied features using an advantageously simple process flow. Preferably, parts of a selectively definable layer (e.g., a photoresist layer) corresponding to the array, interface and periphery areas of an integrated circuit are simultaneously patterned. Pitch multiplication is used to form pitch multiplied spacers in the array region. At least some parts of the interface and the periphery regions are protected using a protective material while other parts are etched and free-standing spacers are formed in the array region. The protective material is then removed and a pattern including spacers in the array region and features in the interface and the periphery regions are then transferred to a hard mask layer. The hard mask layer can be used to pattern an underlying substrate.

Advantageously, processing according to the preferred embodiments allows for the formation and connection of pitch-multiplied to non-pitch multiplied features using relatively few process steps. The relatively small number of steps can improve the uniformity of process results. Non-uniformities introduced by additional pattern formation and pattern transfer steps can be reduced. Moreover, as discussed herein, because connections of non-pitch multiplied mask elements to pitch multiplied mask elements can be formed simultaneously on the same vertical level with the non-pitch multiplied mask elements, defects caused by misaligning separately formed mask elements can be reduced. Thus, connections to pitch multiplied features can be formed more reliably, thereby reducing the possibility of shorts and poorly connected pitch-multiplied features. In addition, the relatively low number of process steps advantageously allows for the fabrication of integrated circuits with high throughput and relatively low cost.

Reference will now be made to the Figures, wherein like numerals refer to like parts throughout. It will be appreciated that these Figures are not necessarily drawn to scale.

Initially, a stack of layers suitable for forming a pattern in a hard mask layer is formed.

Figure 2A:
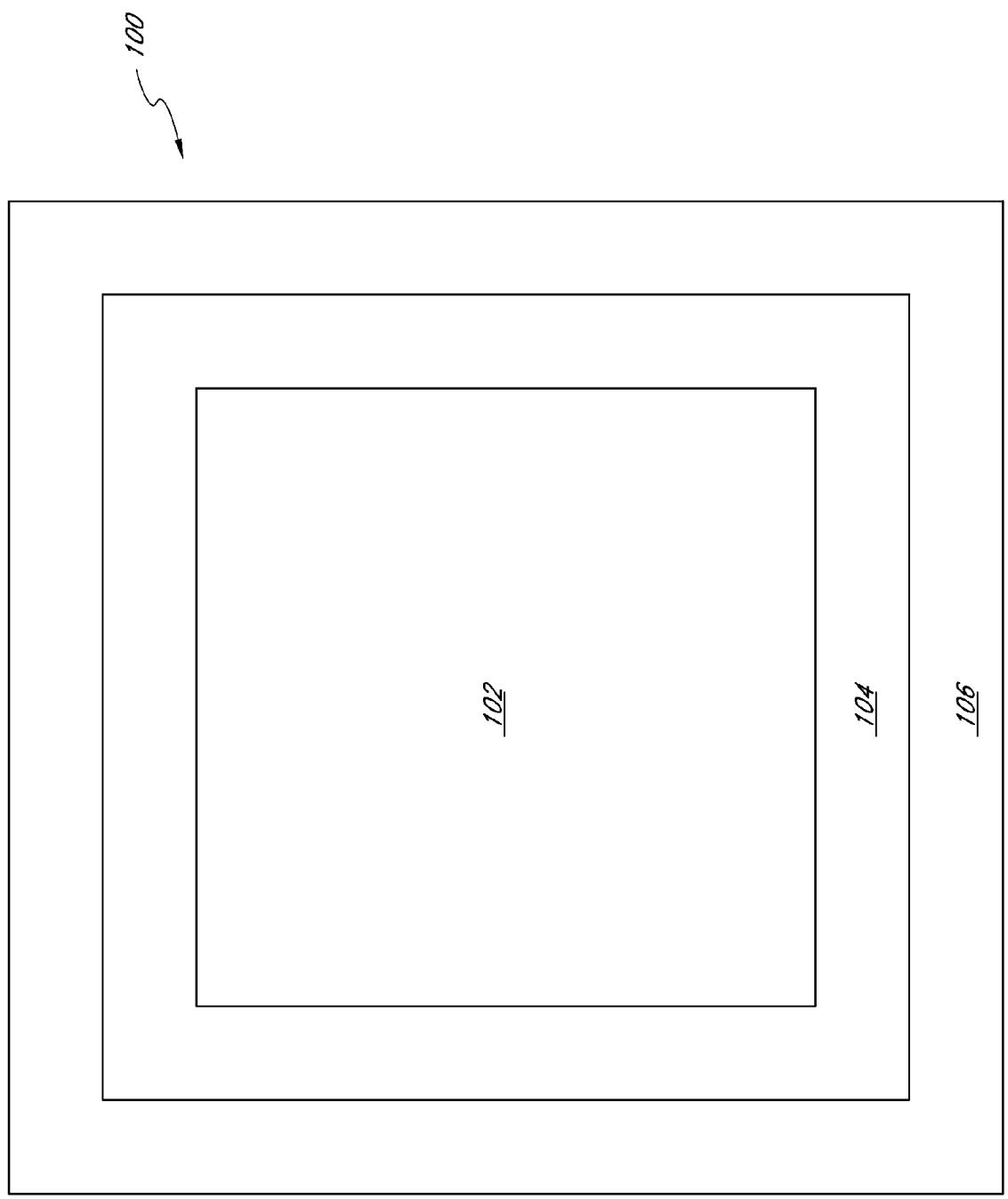
FIG. 2A is a schematic top plan view of a partially formed integrated circuit, in accordance with preferred embodiments of the invention.

With reference to FIG. 2A, a top view of a partially fabricated integrated circuit 100 is shown. While the preferred embodiments can be used to form any integrated circuit, they are particularly advantageously applied to form devices having arrays of electrical devices, including memory cell arrays for volatile and non-volatile memory devices such as DRAM, ROM or flash memory, including NAND flash memory, or integrated circuits having logic or gate arrays. The logic array can be a field programmable gate array (FPGA) having a core array similar to a memory array and a periphery with supporting logics. As a result, the integrated circuit 100 can be, e.g., a memory chip or a processor, which can include both a logic array and embedded memory, or any other integrated circuit having arrays of features, such as a logic or a gate array.

With continued reference to FIG. 2A, a central region 102, the array region or simply "array," is surrounded by a interface region 104, which is surrounded by a peripheral region 106, also referred to as the "periphery." It will be appreciated that, after fabrication of the integrated circuit 100 is completed, the array 102 will typically be densely populated with conducting lines and electrical devices such as transistors and capacitors. In a memory device, the electrical devices form a plurality of memory cells, which are typically arranged in a regular grid pattern at the intersection of word lines and bit lines. Desirably, pitch multiplication can be used to form features such as rows and/or columns of transistors and capacitors in the array 102, as discussed below.

On the other hand, the periphery 106 typically comprises features larger than those in the array 102. Conventional photolithography, rather than pitch multiplication, is preferably used to pattern features, such as logic circuitry, in the periphery 106, because the geometric complexity of logic circuits located in the periphery 106 makes using pitch multiplication difficult. For example, features in the periphery 106 typically do not have the repeating regularity of features typical in the array 102. Moreover, the logic area need not be as dense as the array regions 102, such that pitch multiplication in the logic area is unnecessary. In contrast, the regular grid typical of array patterns is conducive to pitch multiplication. In addition, some devices in the periphery require larger geometries due to electrical constraints, thereby making pitch multiplication less advantageous than conventional photolithography for such devices.

The interface region 104 can contain both array and periphery features. For example, the interface region 104 can serve as a transition from the array 102 to the periphery 106 and allow contact between features in the array 102 and features in the periphery 106.

While schematically illustrated as concentric regions, it will be appreciated by the skilled artisan that the relative positions, and the number of array 102, interface 104 and periphery 106 regions in the integrated circuit 100 may vary from that depicted. For example, in some areas of the integrated circuit 100, the interface 104 and periphery 106 regions may be disposed directly with either side of the array region 102, as illustrated in some of the figures below. Moreover, while certain specific characteristics of these regions have been noted above and clear demarcations between the regions have been illustrated for ease of discussion, in some arrangements, two or more of the regions can overlap.

Figure 2B:
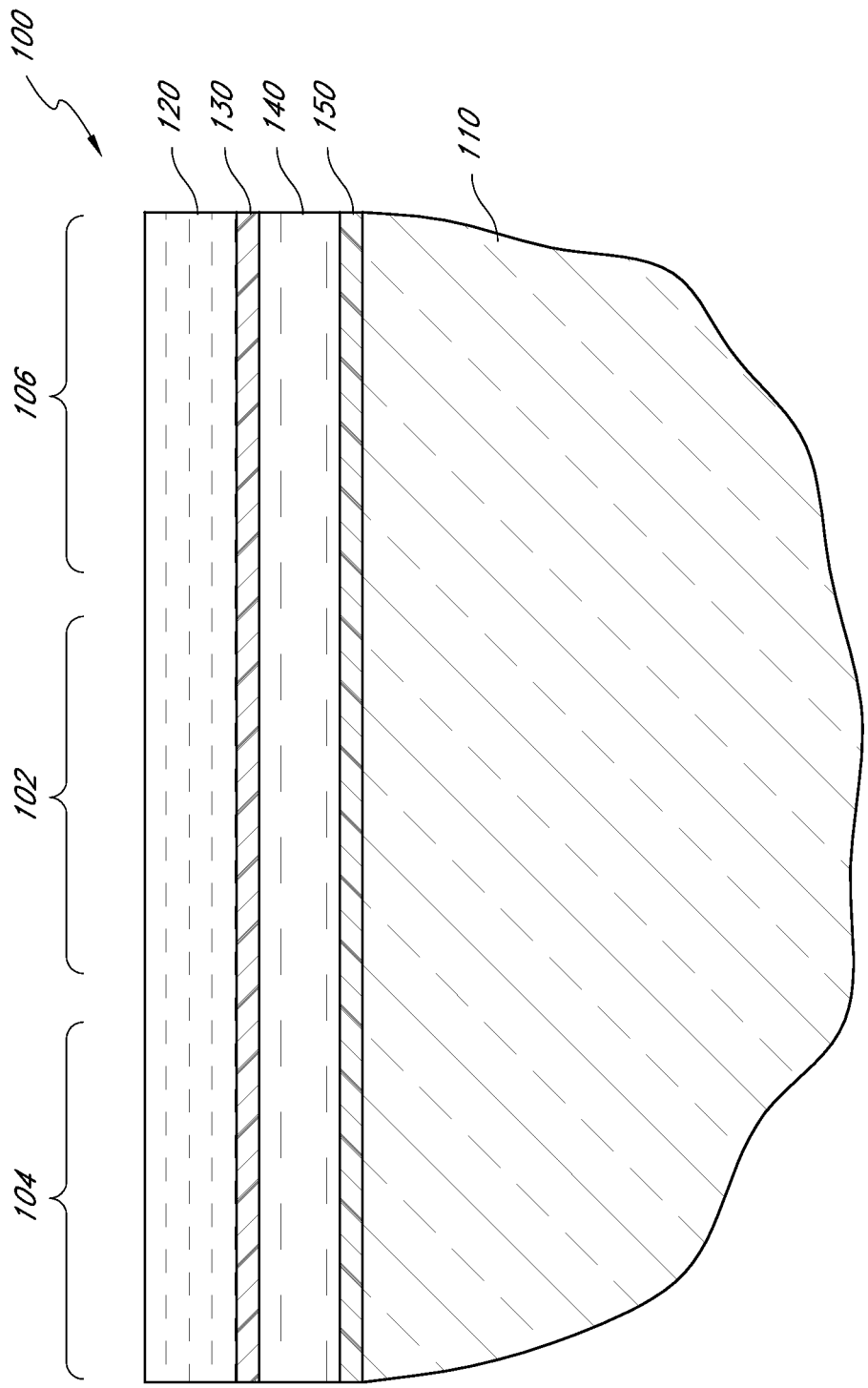
FIG. 2B is a schematic cross-sectional side view of the partially formed integrated circuit of FIG. 2A, in accordance with preferred embodiments of the invention.

FIG. 2B shows a cross-sectional side view of the partially formed integrated circuit 100. Various masking layers 120-150 are preferably provided above a substrate 110. The layers 120-150 will be etched to form a mask for patterning the substrate 110, as discussed below.

The materials for the layers 120-150 overlying the substrate 110 are preferably chosen based upon consideration of the chemistry and process conditions for the various pattern forming and pattern transferring steps discussed herein. Because the layers between a topmost selectively definable (e.g., photodefinable) layer 120 and the substrate 110 preferably function to transfer a pattern derived from the selectively definable layer 120 to the substrate 110, the layers 130-150 between the selectively definable layer 120 and the substrate 110 are preferably chosen so that they can be selectively etched relative to other exposed materials. It will be appreciated that a material is considered selectively, or preferentially, etched when the etch rate for that material is at least about 2-3 times greater, preferably at least about 10 times greater, more preferably at least about 20 times greater and, most preferably, at least about 50 times greater than that for surrounding materials. Because a goal of the layers 120-140 overlying a second hard mask layer 150 is to allow well-defined patterns to be formed in the second hard mask layer 150, it will be appreciated that one or more of the layers 120-140 can be omitted or substituted if suitable other materials, chemistries and/or process conditions are used.

In the illustrated embodiment, the selectively definable layer 120 overlies a first hard mask, or etch stop, layer 130, which overlies a temporary layer 140, which overlies the second hard mask, or etch stop, layer 150, which overlies the substrate 110 to be processed (e.g., etched) through a mask. Preferably, the mask through which the substrate 110 is processed is formed in the second hard mask layer 150.

With continued reference to FIG. 2B, the selectively definable layer 120 is preferably photodefinable, e.g., formed of a photoresist, including any photoresist known in the art. For example, the photoresist can be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, can be used to define the photodefinable layer 120. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the first hard mask layer 130 preferably comprises an inorganic material. Exemplary materials include silicon oxide ($SiO_2$), silicon or a dielectric anti-reflective coating (DARC), such as a silicon-rich silicon oxynitride. In the illustrated embodiment, the first hard mask layer 130 is a dielectric anti-reflective coating (DARC). Using DARCs for the first hard mask layer 130 can be particularly advantageous for forming patterns having pitches near the resolution limits of a photolithographic technique. The DARCs can enhance resolution by minimizing light reflections, thus increasing the precision with which photolithography can define the edges of a pattern.

The temporary layer 140 is preferably formed of amorphous carbon, which offers very high etch selectivity relative to the preferred hard mask materials. More preferably, the amorphous carbon is a form of amorphous carbon that is highly transparent (so-called "transparent carbon") to light and that offers improvements for photo-alignment by being transparent to the wavelengths of light used for such alignment. Deposition techniques for forming such transparent carbon can be found in A. Helmbold, D. Meissner, Thin Solid Films, 283 (1996) 196-203, the entire disclosure of which is incorporated herein by reference.

Figure 11:
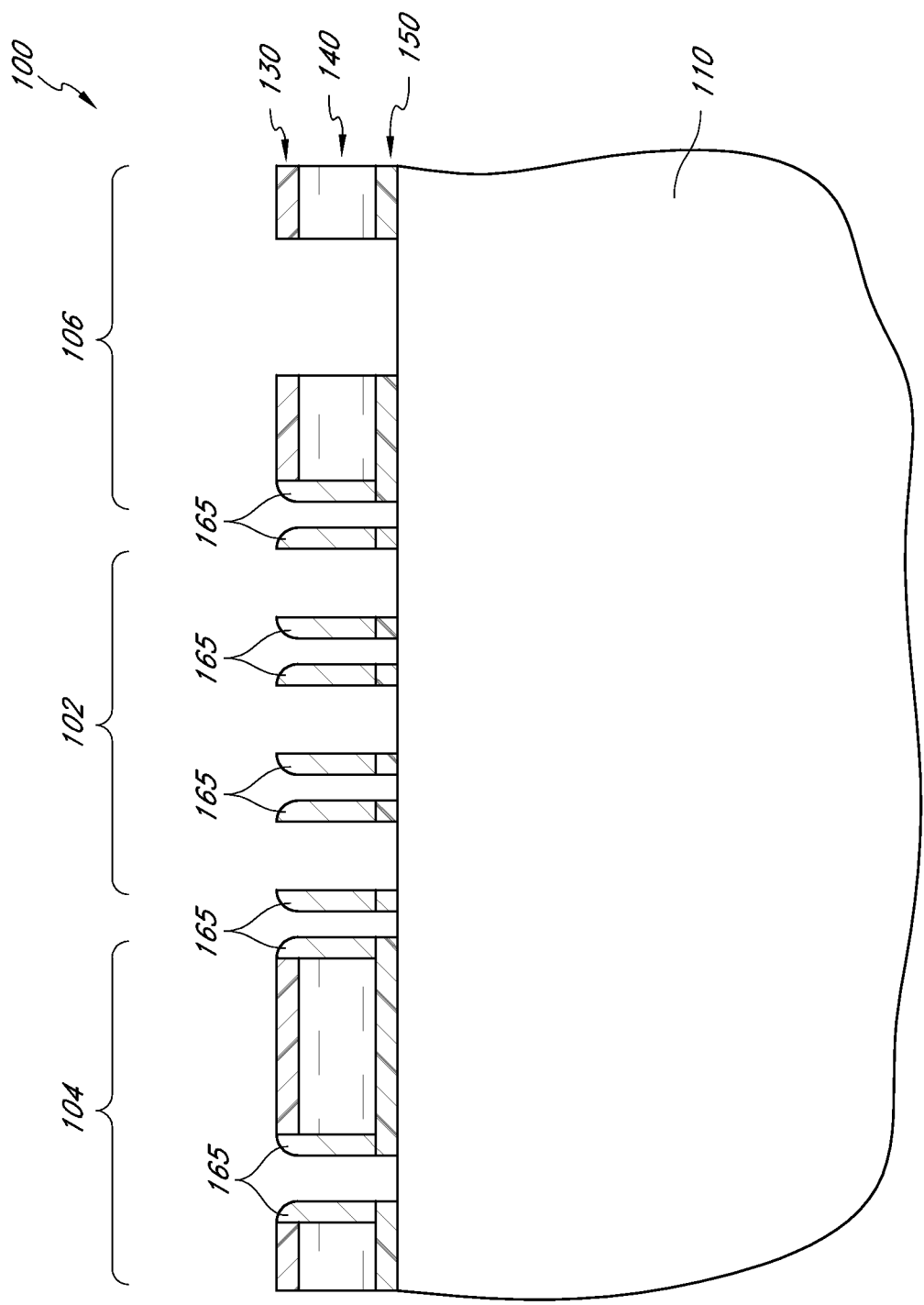
FIG. 11 is a schematic, cross-sectional side view of the partially formed integrated circuit of FIGS. 10A-10B after etching the pattern of pitch multiplied and non-pitch multiplied mask elements into an underlying hard mask layer, in accordance with preferred embodiments of the invention.

The second hard mask layer 150 can be formed of a hard mask material suitable for etching the underlying substrate 110 and which can be selectively etched relative to exposed overlying materials, such as spacers 165 (FIG. 11). For example, in some embodiments where the spacer material (FIG. 11) is silicon oxide or silicon, the hard mask material can be silicon nitride. In other embodiments where the spacer material is silicon nitride or silicon, the hard mask material can be silicon oxide. In the illustrated embodiment, the hard mask material is a nitride, preferably silicon nitride.

It will be appreciated that the substrate 110 can include a layer of a single material, a plurality of layers of different materials, a layer or layers having regions of different materials or structures in them, etc. These materials can include semiconductors, insulators, conductors, or combinations thereof. For example, the substrate can comprise doped polysilicon, an electrical device active area, a silicide, or a metal layer, such as a tungsten, aluminum or copper layer, or combinations thereof. In some embodiments, the mask elements discussed below can directly correspond to the desired placement of conductive features, such as interconnects or landing pads, in the substrate. In the illustrated embodiment, the upper portion of the substrate 110 includes an insulator and the location of mask elements can correspond to the desired location of insulators, such as in damascene metallization. Examples of structures formed in the substrate include interconnects, gate stacks and shallow trench isolation structures.

The layers 120-150 discussed herein can be formed by various methods. For example, spin-on-coating processes can be used to form photodefinable layers. Various vapor deposition processes, such as chemical vapor deposition, can be used to form hard mask layers. Preferably, a low temperature chemical vapor deposition (CVD) process is used to deposit the hard mask layers or any other materials, e.g., spacer material, over the temporary layer 140, especially in cases where the temporary layer 140 is formed of amorphous carbon.

The amorphous carbon for the temporary layer 140 can be formed by chemical vapor deposition using a hydrocarbon compound, or mixtures of such compounds, as carbon precursors. Exemplary precursors include propylene, propyne, propane, butane, butylene, butadiene and acetelyne. A suitable method for forming amorphous carbon layers is described in U.S. Pat. No. 6,573,030 B1, issued to Fairbairn et al. on Jun. 3, 2003, the entire disclosure of which is incorporated herein by reference. In addition, the amorphous carbon may be doped. A suitable method for forming doped amorphous carbon is described in U.S. patent application Ser. No. 10/652,174 to Yin et al., the entire disclosure of which is incorporated herein by reference.

Next, patterns are formed and transferred to the hard mask layer 150.

It will be appreciated that in any of the steps described herein, transferring a pattern from an overlying level to an underlying level involves forming integrated circuit features or mask elements in the underlying level that generally correspond to mask elements in the overlying level. For example, the path of lines in the underlying level will generally follow the path of lines in the overlying level and the location of other elements or features in the underlying level will correspond to the location of similar elements or features in the overlying level. The precise shapes and sizes of elements or features can vary from the overlying level to the underlying level, however. For example, depending upon etch chemistries and conditions, the sizes of and relative spacing between the elements or features forming the transferred pattern can be enlarged or diminished relative to the pattern on the overlying level, while still resembling the same initial "pattern," as can be seen from the example of shrinking the first resist mask in the embodiments described below. Thus, even with some changes in the dimensions of elements or features, the transferred pattern is still considered to be the same pattern as the initial pattern. In contrast, forming spacers around mask elements can form new (pitch multiplied) patterns.

Figure 3:
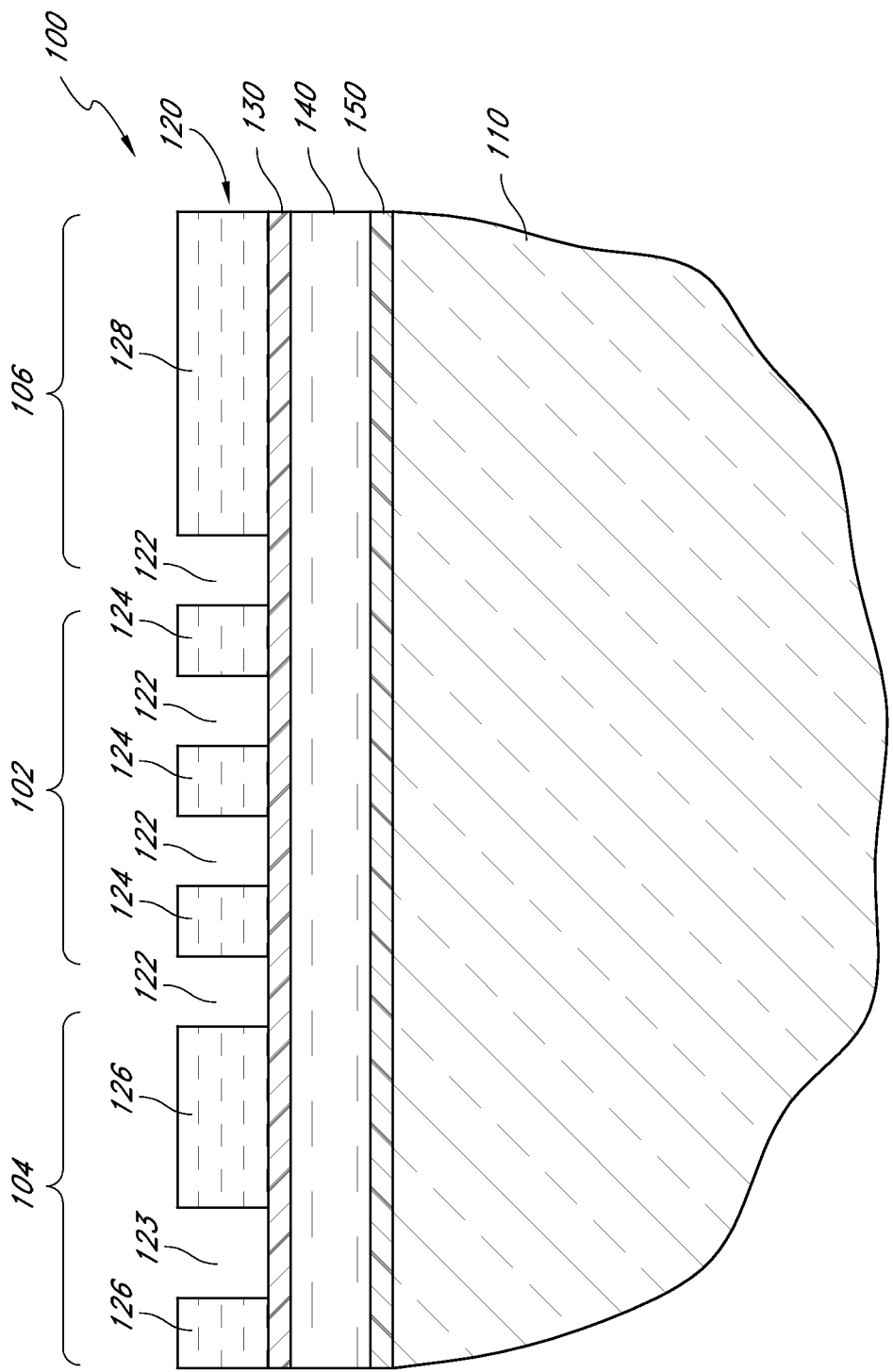
FIG. 3 is a schematic cross-sectional side view of the partially formed integrated circuit of FIGS. 2A-2B after forming lines in a photoresist layer, in accordance with preferred embodiments of the invention.

With reference to FIG. 3, a pattern comprising spaces or trenches 122, 123 which are delimited by array elements 124, interface elements 126 and periphery element 128, is formed in the photodefinable layer 120. The elements 124, 126, 128 are formed of photodefinable material. The trenches 122, 123 can be formed by, e.g., photolithography with 248 nm or 193 nm light, in which the layer 120 is exposed to radiation through a reticle and then developed. After being developed, the remaining photodefinable material, photoresist in the illustrated embodiment, forms the illustrated elements 124, 126, 128 (shown in cross-section only). In the illustrated embodiment, the array elements 124 are lines.

The pitch of the lines 124 is equal to the sum of the width of a line 124 and the width of a neighboring space 122. To minimize the critical dimensions of elements formed using this pattern of lines 124 and spaces 122, the pitch can be at or near the limits of the photolithographic technique used to pattern the photodefinable layer 120. For example, for photolithography utilizing 248 nm light, the pitch of the lines 124 can be about 100 nm. Thus, the pitch may be at the minimum pitch of the photolithographic technique and the spacer pattern discussed below can advantageously have a pitch below the minimum pitch of the photolithographic technique. Alternatively, because the margin of error for position and element size typically increases as the limits of a photolithographic technique are approached, the lines 124 can be formed having larger element sizes, e.g., for a pitch of about 200 nm, to minimize errors in the position and sizes of the lines 124.

Figure 4:
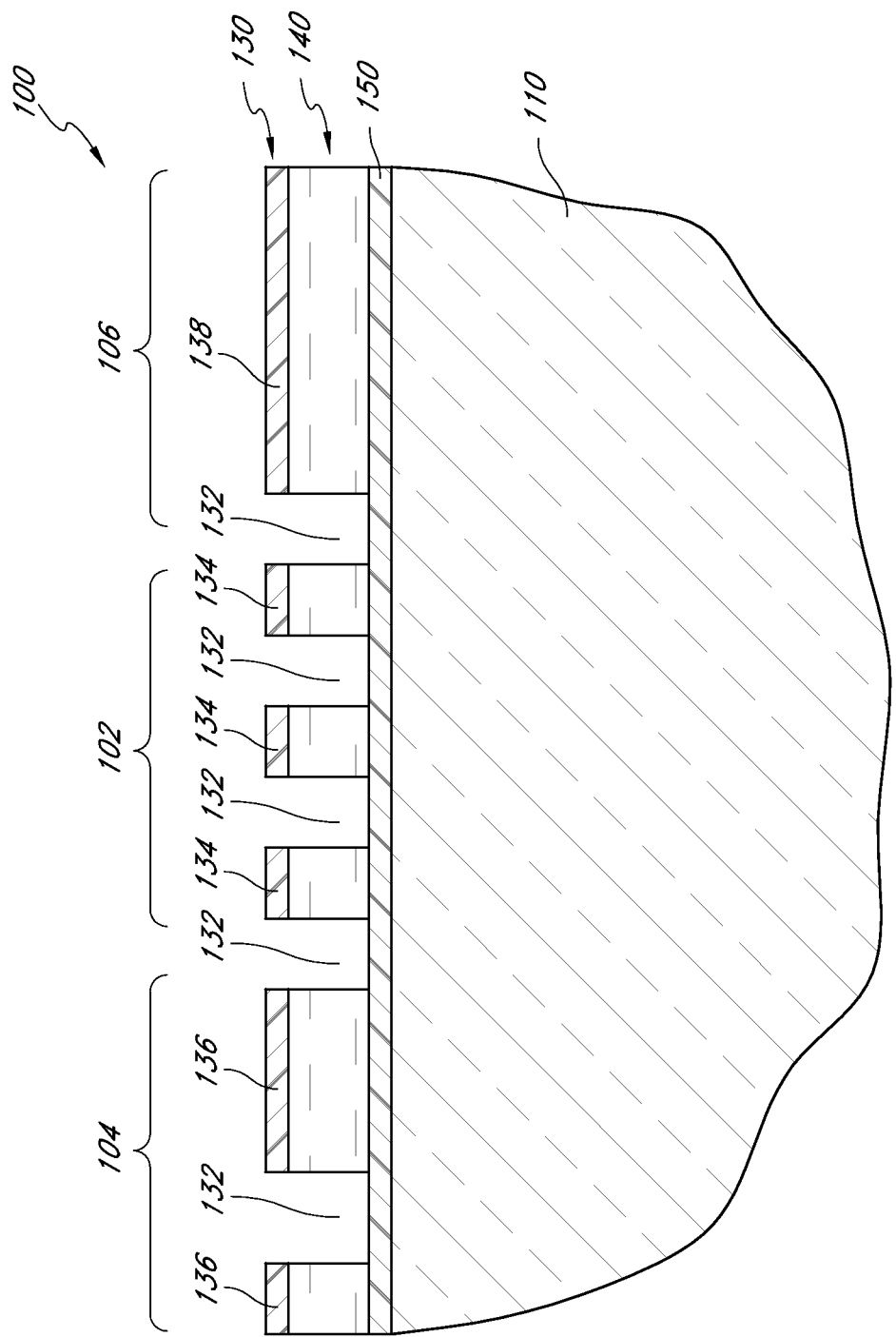
FIG. 4 is a schematic cross-sectional side view of the partially formed integrated circuit of FIG. 3 after transferring the pattern in the photoresist layer to underlying hard mask and temporary layers and removing the photoresist layer, in accordance with preferred embodiments of the invention.
Figure 6:
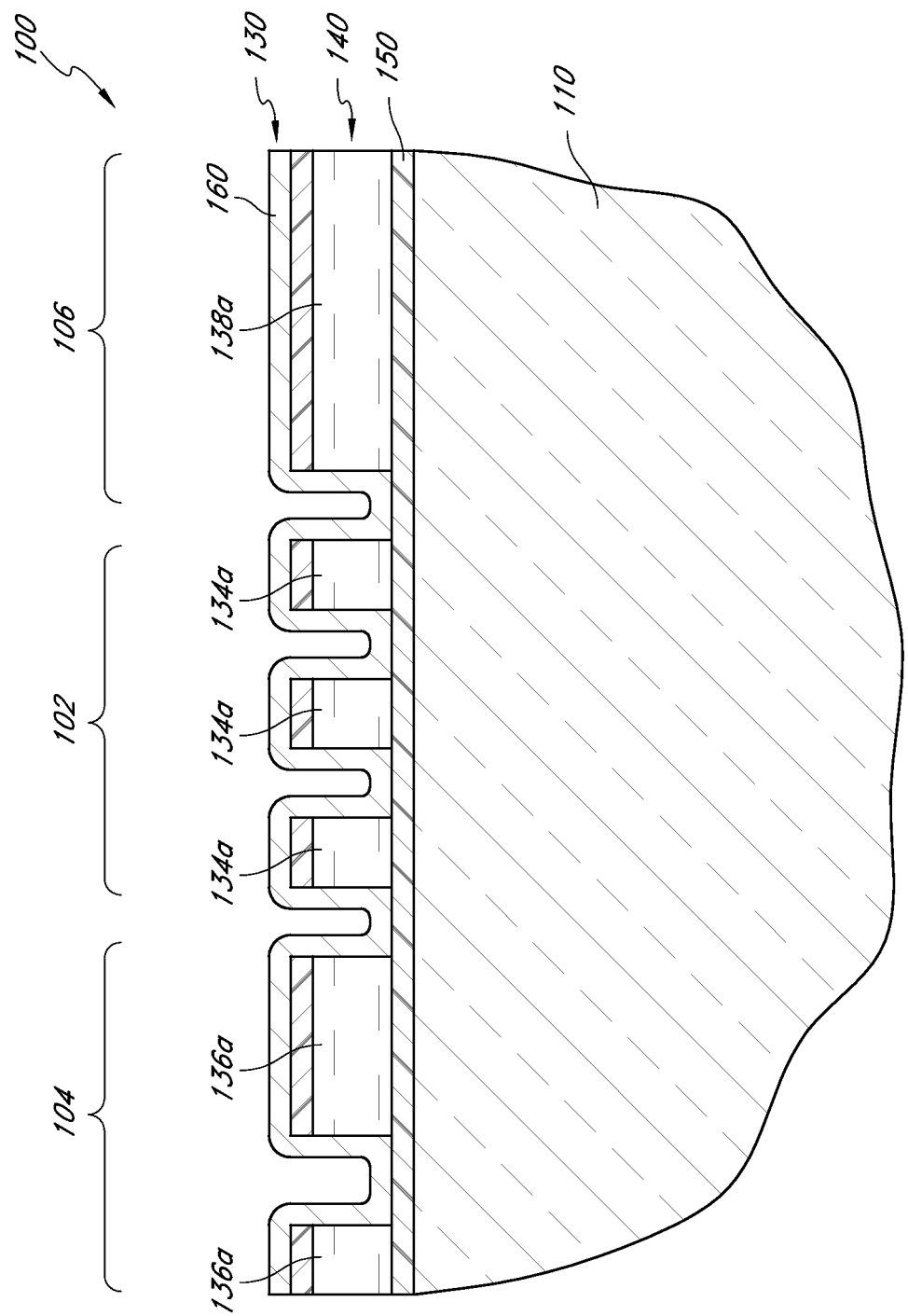
FIG. 6 is a schematic cross-sectional side view of the partially formed integrated circuit of FIG. 5 after depositing a layer of a spacer material, in accordance with preferred embodiments of the invention.

With reference to FIG. 4, the pattern in the photodefinable layer 120 is transferred to the hard mask layer 130 and the temporary layer 140 to allow for deposition of a layer 160 of spacer material (FIG. 6). It has been found that the temperatures used for spacer material deposition are typically too high for photoresist to withstand. Thus, the pattern is preferably transferred from the photodefinable layer 120 to the first hard mask layer 130 and the temporary layer 140, which are formed of materials that can withstand the process conditions for spacer material deposition and etch, discussed below. In addition to having higher heat resistance than photoresist, the material forming the temporary layer 140 is preferably selected such that it can be selectively removed relative to the material for the spacers 165 (FIG. 10) and for the underlying second hard mask layer 150. As noted above, the layer 140 is preferably formed of amorphous carbon and, more preferably, transparent carbon.

The pattern transfer may be accomplished in a single step; that is, in situ in a single process chamber. The transfer is preferably accomplished using anisotropic etches. Preferred etch chemistries include an etch using fluorocarbon plasma, e.g., plasma generated from $HBr/CF_4$, to etch the first hard mask layer 130 and an oxygen-containing plasma, e.g., a $SO_2/O_2$ plasma, to etch the temporary layer 140. The etches selectively etch the first hard mask layer 130 relative to the photodefinable layer 120 and then continue through the temporary layer 140, stopping at the second hard mask layer 150. Part of the photodefinable layer 120 may be etched during the pattern transfer. Any remaining resist forming the photodefinable layer 120 can subsequently be separately removed by various processes known by the skilled artisan, including, e.g., by plasma ashing.

Figure 5:
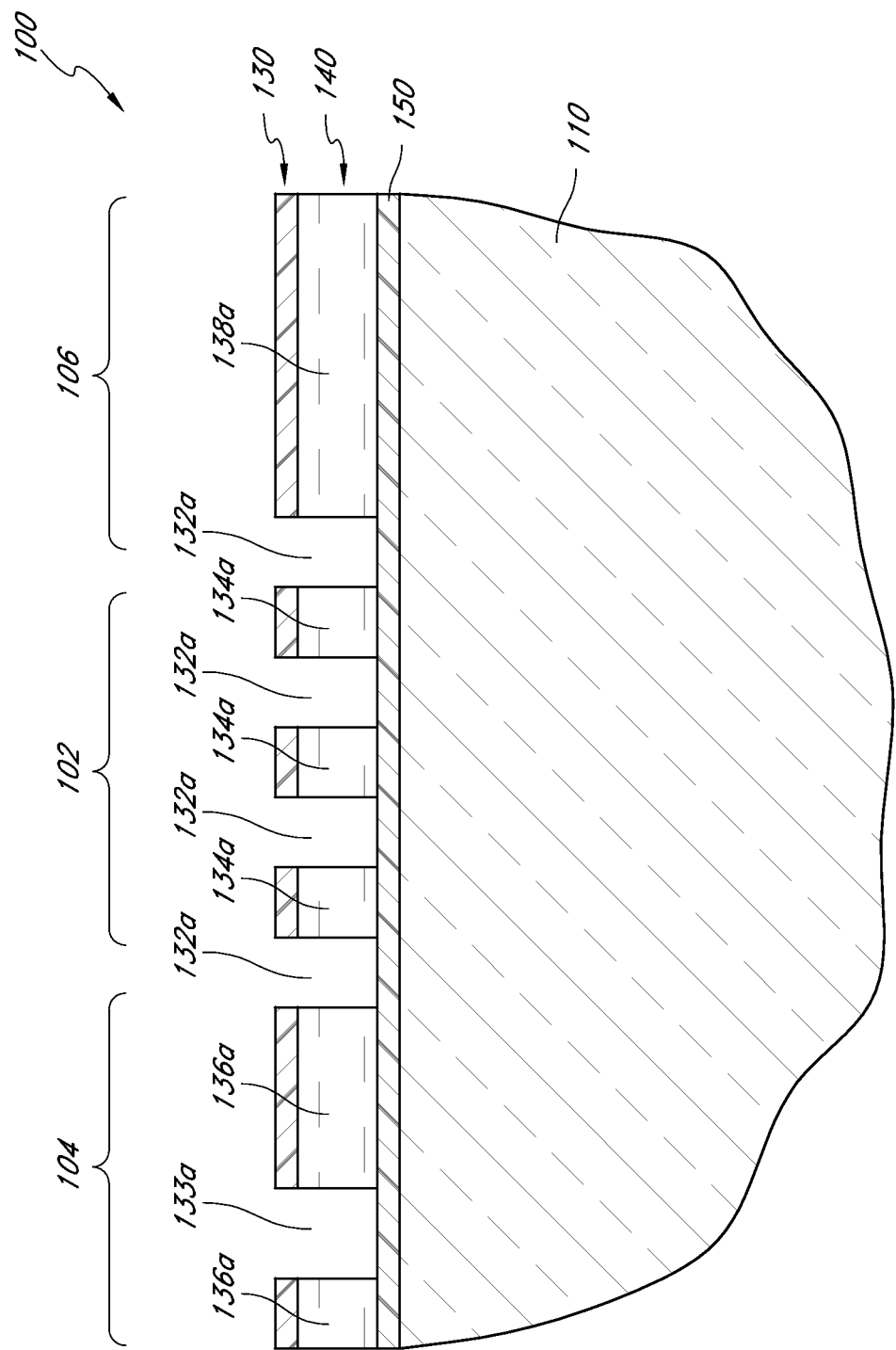
FIG. 5 is a schematic cross-sectional side view of the partially formed integrated circuit of FIG. 4 after performing a trim etch to widen spaces between mask elements, in accordance with preferred embodiments of the invention.

With reference to FIGS. 4 and 5, spaces 132, 133 between array elements 134, interface elements 136 and periphery elements 138 are preferably widened by etching the elements 134, 136, 138 to form modified spaces 132a, 133a and elements 134a, 136a, 138a after a trim etch. The elements 134, 136, 138 are preferably etched using an isotropic etch to "shrink" those elements. Suitable etches include etches using an oxygen-containing plasma, e.g., a $SO_2/O_2/N_2/Ar$ plasma, a $Cl_2/O_2/He$ plasma or a $HBr/O_2/N_2$ plasma. The extent of the etch is preferably selected so that the widths of the elements 134a, 136a, 138a allow for the formation of spacers 165 (FIG. 7A) having a desired spacing, as will be appreciated from the discussion below. For example, the width of the elements 134, 136, 138 in the array can be reduced to from about 80-120 nm to about 40-70 nm. Advantageously, the width-reducing etch can form lines in the array that are narrower than would otherwise be possible using the photolithographic technique used to pattern the photodefinable layer 120. In addition, the etch can smooth the edges of the elements 134a, 136a, 138a thus improving the uniformity of those elements. While the elements 134a, 136a, 138a can be trimmed to have critical dimensions below the resolution limits of the photolithographic technique, it will be appreciated that this trim does not alter the pitch of the spaces 132a, 133a and elements 134a, 136a, 138a in the array, since the distance between identical points in those elements remains the same. In other embodiments, instead of or in addition to performing a trim etch on the elements 134, 136, 138, it will be appreciated that the elements 124, 126, 128 (FIG. 3) in the photodefinable layer 120 can be subjected to a trim etch before transferring the pattern from the photodefinable layer 120 to the first hard mask layer 130, to form elements of desired size in the hard mask layer 130 and temporary layer 140.

With reference to FIG. 6, a layer 160 of spacer material is preferably blanket deposited conformally over exposed surfaces, including exposed top surfaces and sidewalls of the hard mask layers 130, 150 and the sidewalls of the temporary layer 140. The spacer material can be any material that can act as a mask for transferring a pattern to the underlying hard mask layer 150. The spacer material preferably: 1) can be deposited with good step coverage; 2) can be deposited at a temperature compatible with other materials in the partially fabricated integrated circuit 100; and 3) can be selectively and anisotropically etched relative to the temporary layer 140 and the first and second hard mask layers 130, 150. Preferred materials include silicon (e.g., amorphous silicon), silicon oxides and silicon nitrides. In the illustrated embodiment, the spacer material is silicon oxide, which provides particular advantages in combination with other selected materials of the masking stack.

Preferred methods for spacer material deposition include chemical vapor deposition and atomic layer deposition. The thickness of the layer 160 is preferably determined based upon the desired width of the spacers 165 (FIG. 10). For example, in the illustrated embodiment, the layer 160 is preferably deposited to a thickness of about 20-80 nm and, more preferably, about 40-60 nm. Preferably, the step coverage is about 80% or greater and, more preferably, about 90% or greater.

Figure 7A:
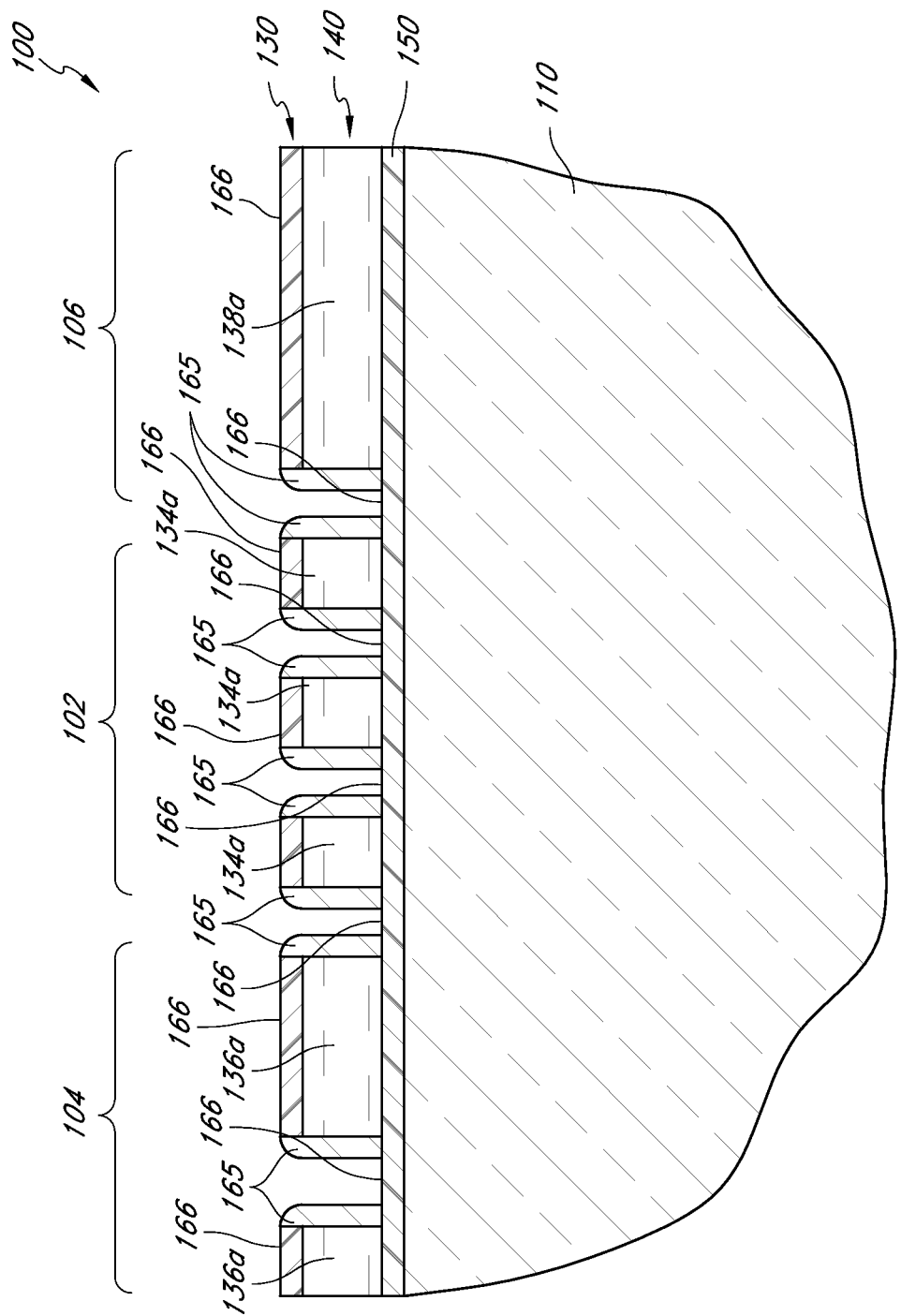
FIGS. 7A-7B are schematic, cross-sectional side and top plan views of the partially formed integrated circuit of FIG. 6 after performing a spacer etch, in accordance with preferred embodiments of the invention.

With reference to FIG. 7A, the silicon oxide spacer layer 160 is subjected to an anisotropic etch to remove spacer material from horizontal surfaces 166 of the partially formed integrated circuit 100. Such an etch, also known as a spacer etch, can be performed on an oxide material using a biased fluorocarbon plasma, e.g., containing $CF_4/CHF_3$, $C_4F_8/CH_2F_2$ or $CHF_3/Ar$ plasma, or with a purely physical sputter etch (e.g., an Ar sputter etch). The spacer etch defines pairs of spacers 165 around mandrels 134a and elements 136a, 138a.

Figure 7B:
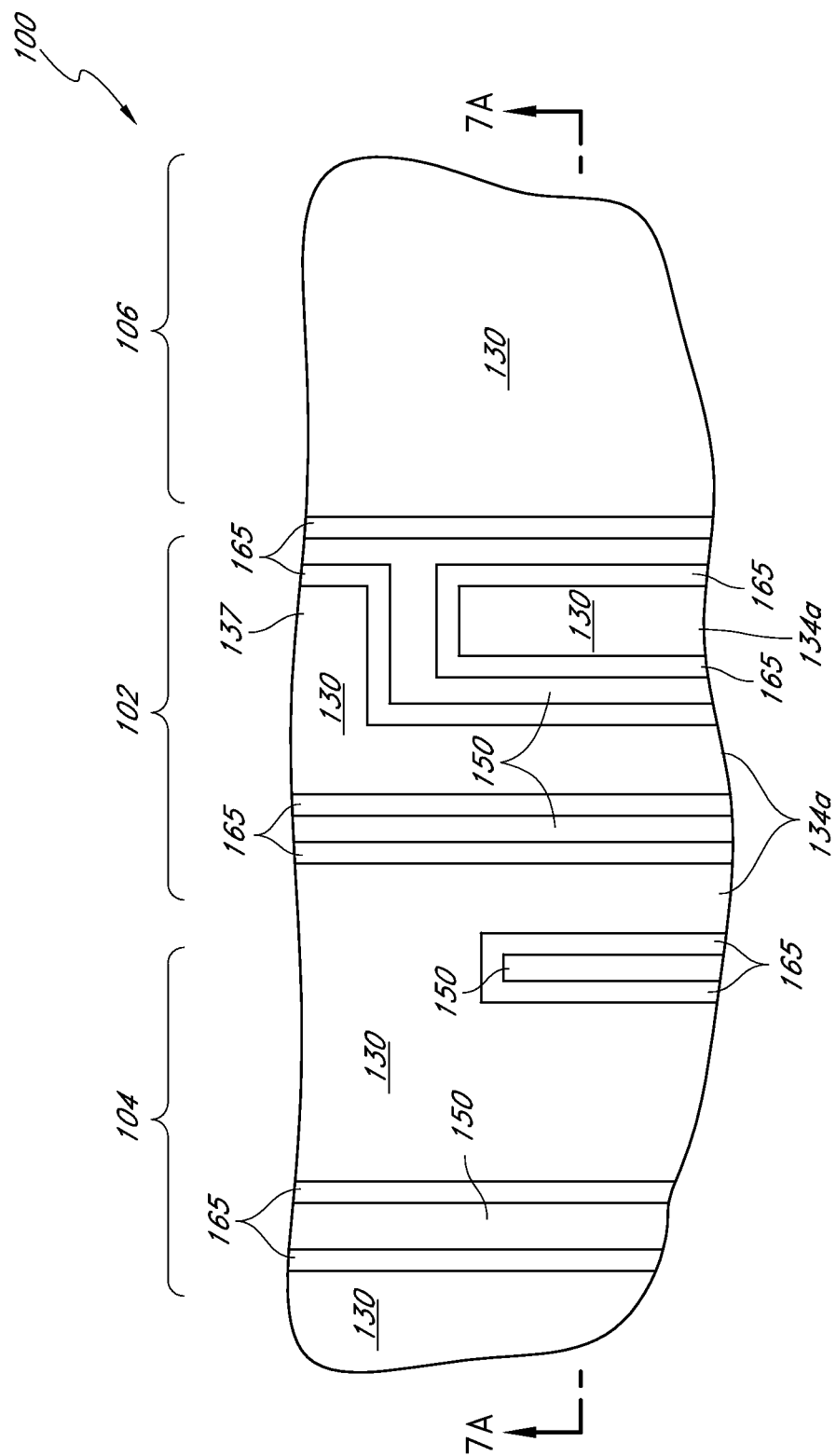

FIG. 7B shows a top plan view of the partially formed integrated circuit 100 of FIG. 7A. As can be seen, the mandrels 134a can have various shapes, in addition to being the shape of a line. As noted above, in the illustrated embodiment, the upper part of the substrate 110 is an insulator and the pattern of the spacers 165 correspond to the desired pattern of insulator to be formed in the substrate 110. Consequently, open space between the spacers 165 preferably corresponds to the desired placement of conductors, such as damascene conductive interconnects, in the substrate 110. For example, any mandrels 134a which are later removed (FIGS. 10A-10B), can have locations corresponding to the locations of later-formed interconnects. In such cases, some mandrels 134a can have widened portions 137 which can be used to form landing pads for electrically connecting interconnects formed using the mandrels 134a with electrical features on other vertical levels.

Figure 8:
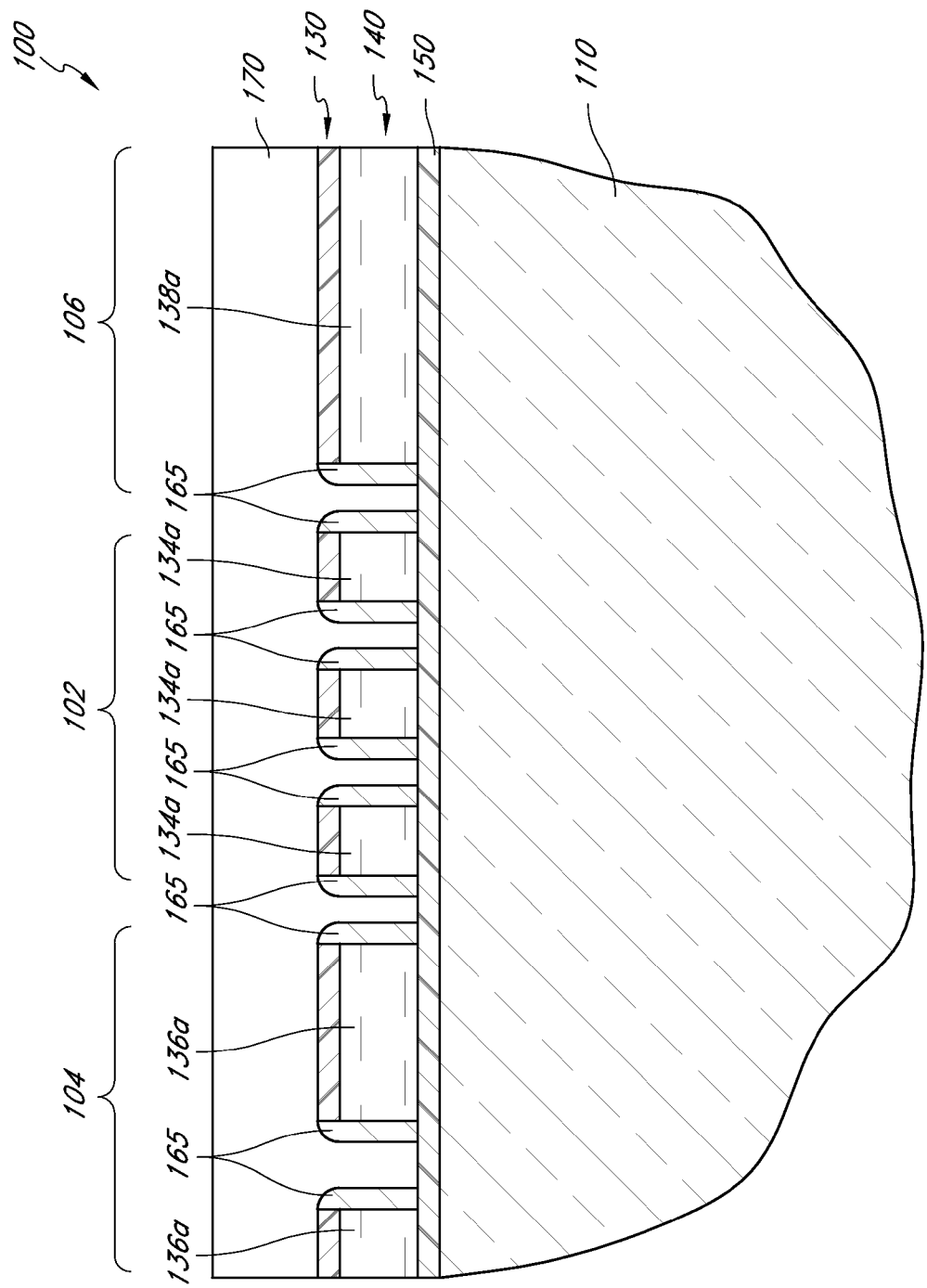
FIG. 8 is a schematic, cross-sectional side view of the partially formed integrated circuit of FIGS. 7A-7B after depositing a layer of protective material, in accordance with preferred embodiments of the invention.

With reference to FIG. 8, a protective layer 170 is deposited over the surface of the partially fabricated integrated circuit 100. The protective layer 170 is preferably also selectively definable. As with the selectively definable layer 120, the protective layer 170 is preferably photodefinable, e.g., formed of a photoresist, including any photoresist known in the art. In addition, in other embodiments, the protective, photodefinable layer 170 can be formed of a resist suitable for patterning by nano-imprint lithography.

Figure 9A:
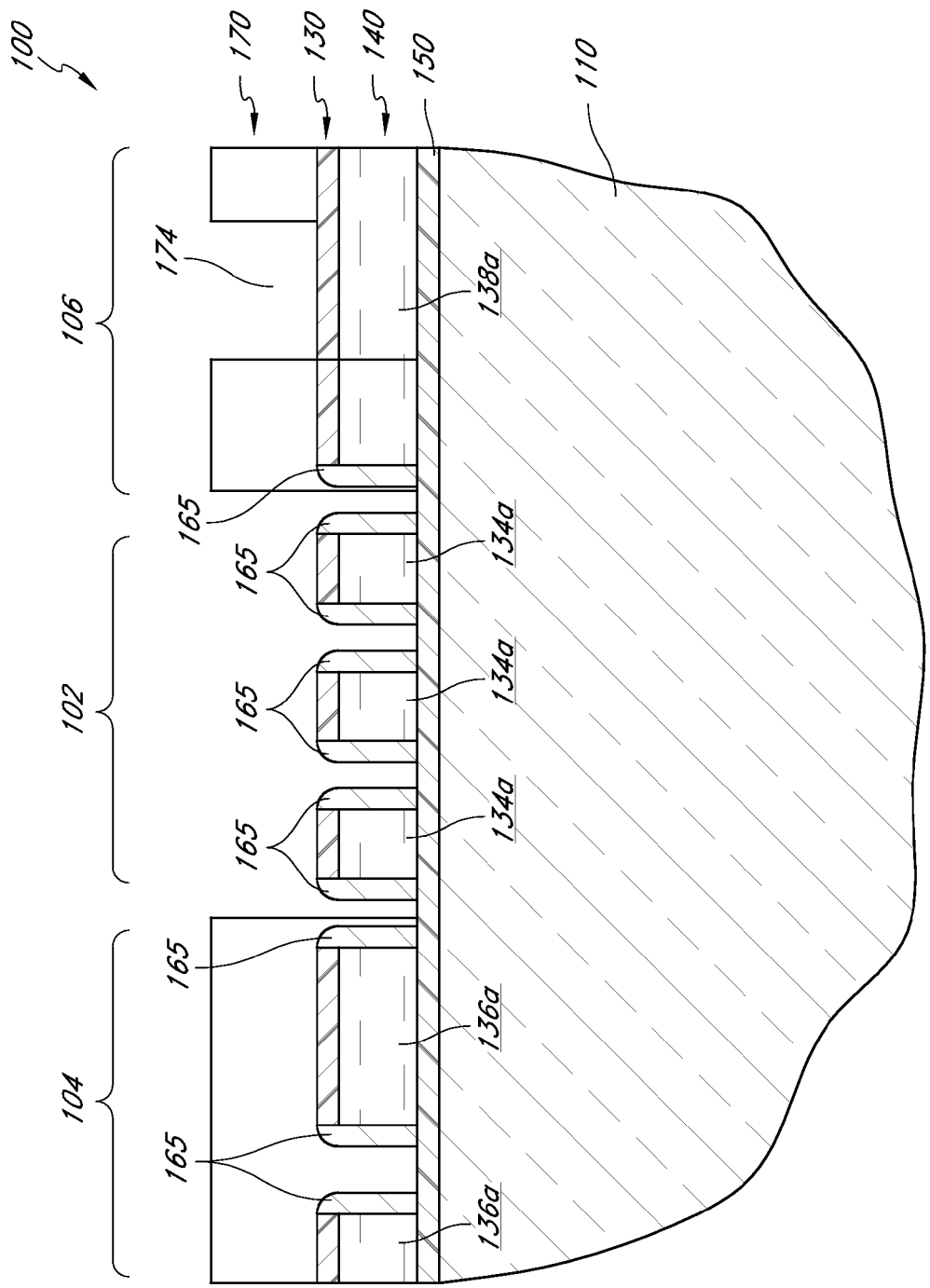
FIGS. 9A-9B are schematic, cross-sectional side and top plan views of the partially formed integrated circuit of FIG. 8 after patterning the protective layer to expose mask elements in the array region and other selected areas of the partially formed integrated circuit, in accordance with preferred embodiments of the invention.

With reference to FIG. 9A, the photodefinable layer 170 is patterned using, e.g., the same photolithographic technique used to pattern the photodefinable layer 120. Preferably, the layer 170 is exposed to radiation through a reticle and then developed to expose elements the array region 102 of the partially fabricated integrated circuit 100. Thus, some spacers or pairs of spacers 165 are exposed, while some are protected by the protective layer 170. In addition, some parts of the hard mask layer 130 are exposed, while some parts are protected.

In addition, elements in the interface areas 104 or periphery 106 can also be patterned, thereby forming, for example, a void 174 in the periphery. It will be appreciated that while the spacers 165 in the array 102 preferably have a pitch or element size smaller than the minimum pitch or resolution of the photolithographic technique used in forming it, elements patterned in the layer 170 preferably have a pitch or element size equal to or greater than the minimum pitch or resolution of the photolithographic technique used to form them.

Figure 9B:
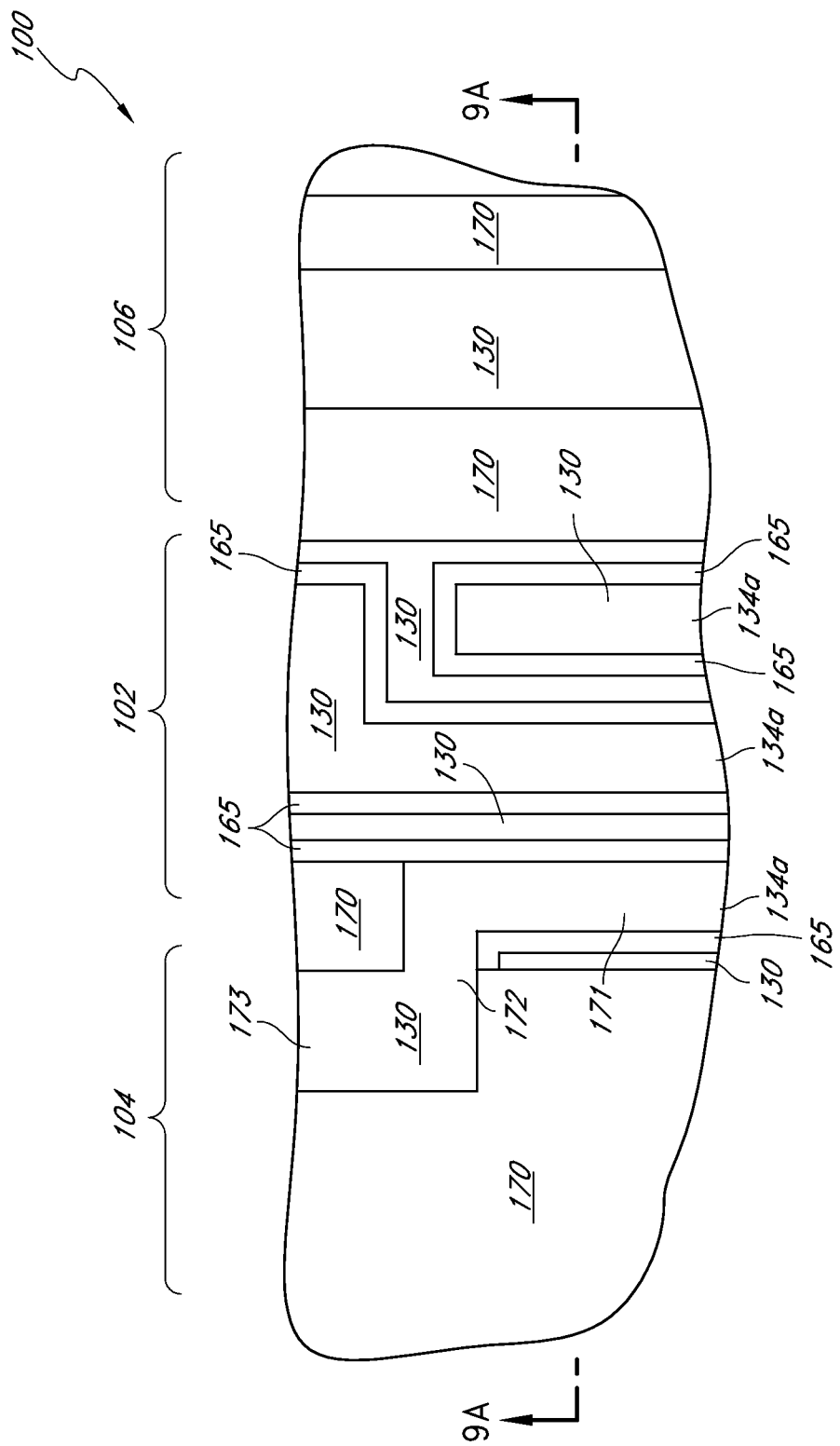

With reference to FIG. 9B, connections 172 to the spaces between the pitch multiplied spacers 165 can be patterned. It will be appreciated that the connections 172 can be the ends of larger dimension elements 173 such as those used to pattern an interconnect in the periphery 106 or interface region 104. The connections 172 can thus connect one or more mandrels 134a to a larger mask element 173 and ultimately allow the formation of a relatively large interconnect connected to pitch-multiplied interconnects in the array 102.

It will be appreciated that some elements of the partially fabricated integrated circuit 100 remain protected by the layer 170. In such cases, spacers 165 augment the dimensions of these elements, after removal of the protective layer 170.

Figure 10A:
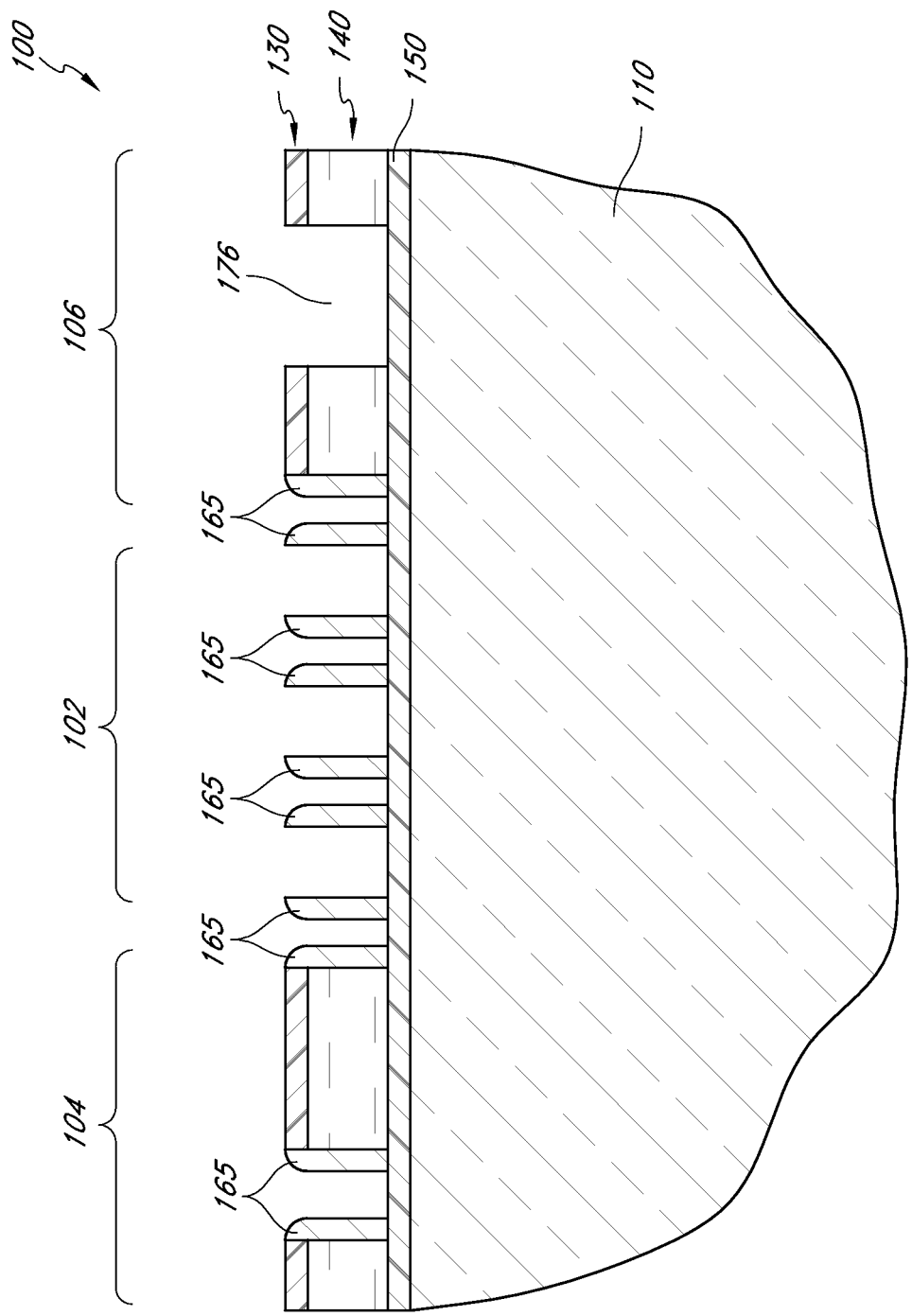
FIGS. 10A-10B are schematic, cross-sectional side and top plan views of the partially formed integrated circuit of FIGS. 9A-9B after removing hard mask and temporary layer material in regions exposed by the patterned protective layer, thereby leaving a pattern of free-standing spacers, and subsequent removal of the protective layer, in accordance with preferred embodiments of the invention.
Figure 10B:
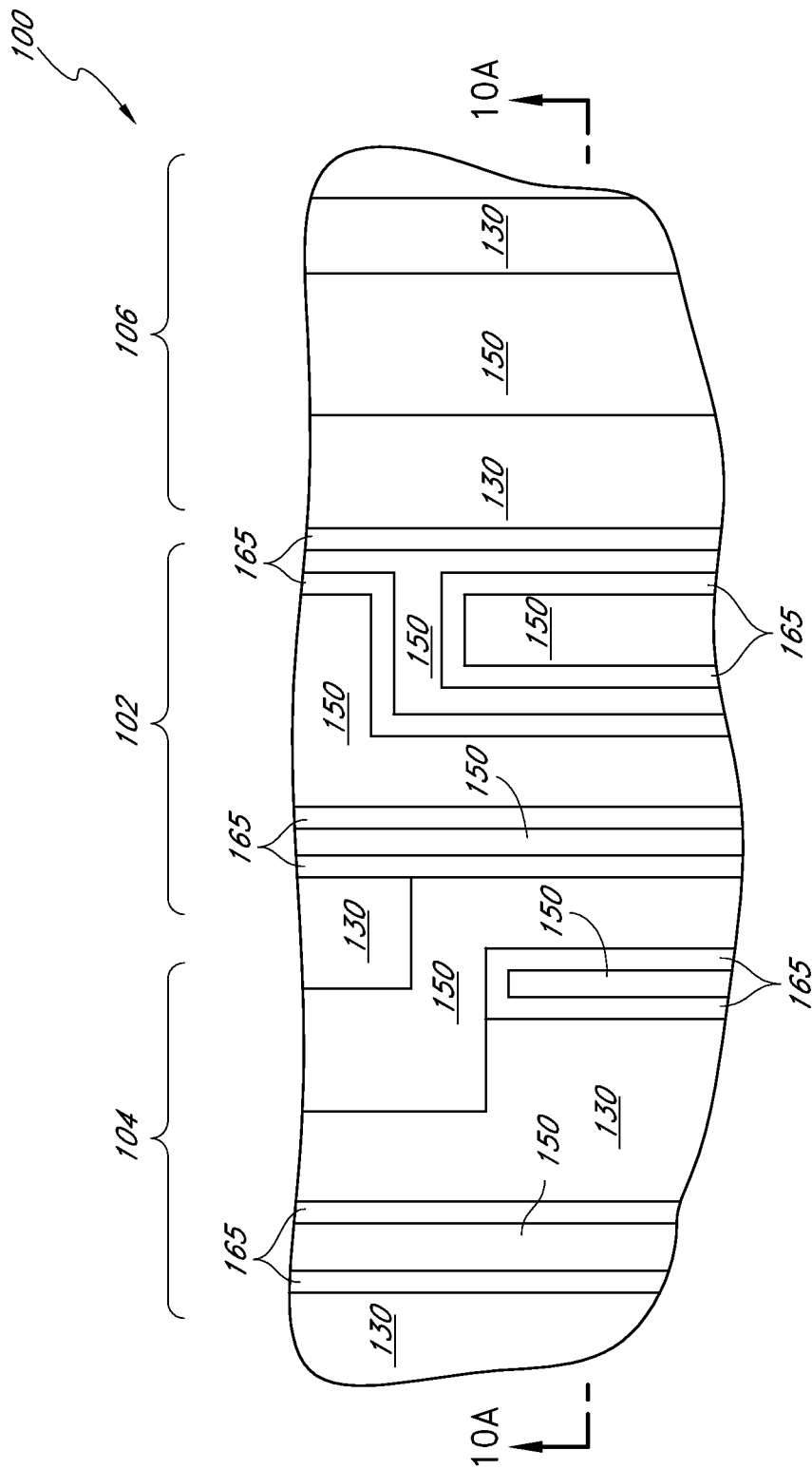

With reference to FIGS. 10A-10B, parts of the first hard mask layer 130 and temporary layer 140 which are left exposed or unprotected by the protective layer 170 are selectively removed, preferably by an anisotropic etch. Advantageously, the unprotected parts of the hard mask layer 130 and the temporary layer 140 can be removed in a single step; that is, in situ in a single process chamber. The hard mask layer 130 can be selectively removed using, e.g., a plasma etch containing $HBr/CF_4$, and the temporary layer 140 can be selectively removed using, e.g., a $SO_2/O_2$ plasma etch. The protective layer 170 is then removed, e.g., by plasma ashing.

Thus, the mandrels 134a (FIG. 9A) are removed, leaving free-standing, pitch multiplied spacers 165 in the array region 102. In the illustrated embodiment, the pitch of the spacers 165 and the spaces between the spacers 165 are roughly half that of the photoresist lines 124 and spaces 122 (FIG. 3) originally formed by photolithography. For example, where the photoresist lines 124 had a pitch of about 200 nm, spacers 165 having a pitch of about 100 nm or less can be formed. In addition, elements patterned in the periphery 106 or interface region 104 are also transferred to the underlying layers, thereby forming, e.g., the void or opening 176 in the hard mask layer 130 and the temporary layer 140.

With reference to FIG. 11, the pattern defined by the spacers 165 and the remaining parts of the first hard mask layer 130 and the temporary layer 140 is transferred to the second hard mask layer 150. The transfer is preferably accomplished using an anisotropic etch, e.g., an etch using a fluorocarbon plasma, e.g., a $CF_4/O_2/CH_2F_2$-containing plasma etch.

Figure 12:
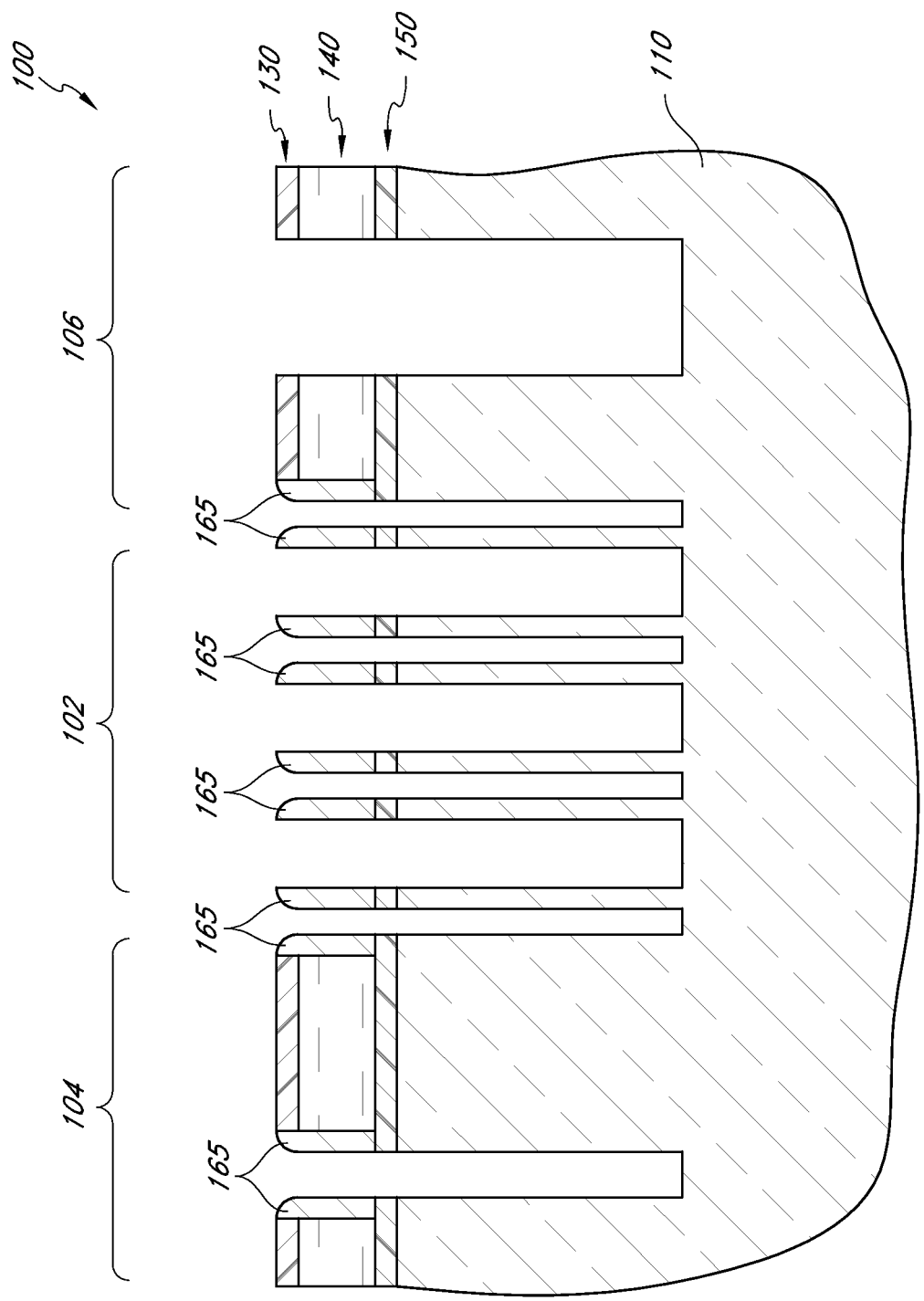
FIG. 12 is a schematic, cross-sectional side view of the partially formed integrated circuit of FIG. 11 after transferring the pattern of pitch multiplied and non-pitch multiplied mask elements to the underlying substrate, in accordance with preferred embodiments of the invention.
Figure 13:
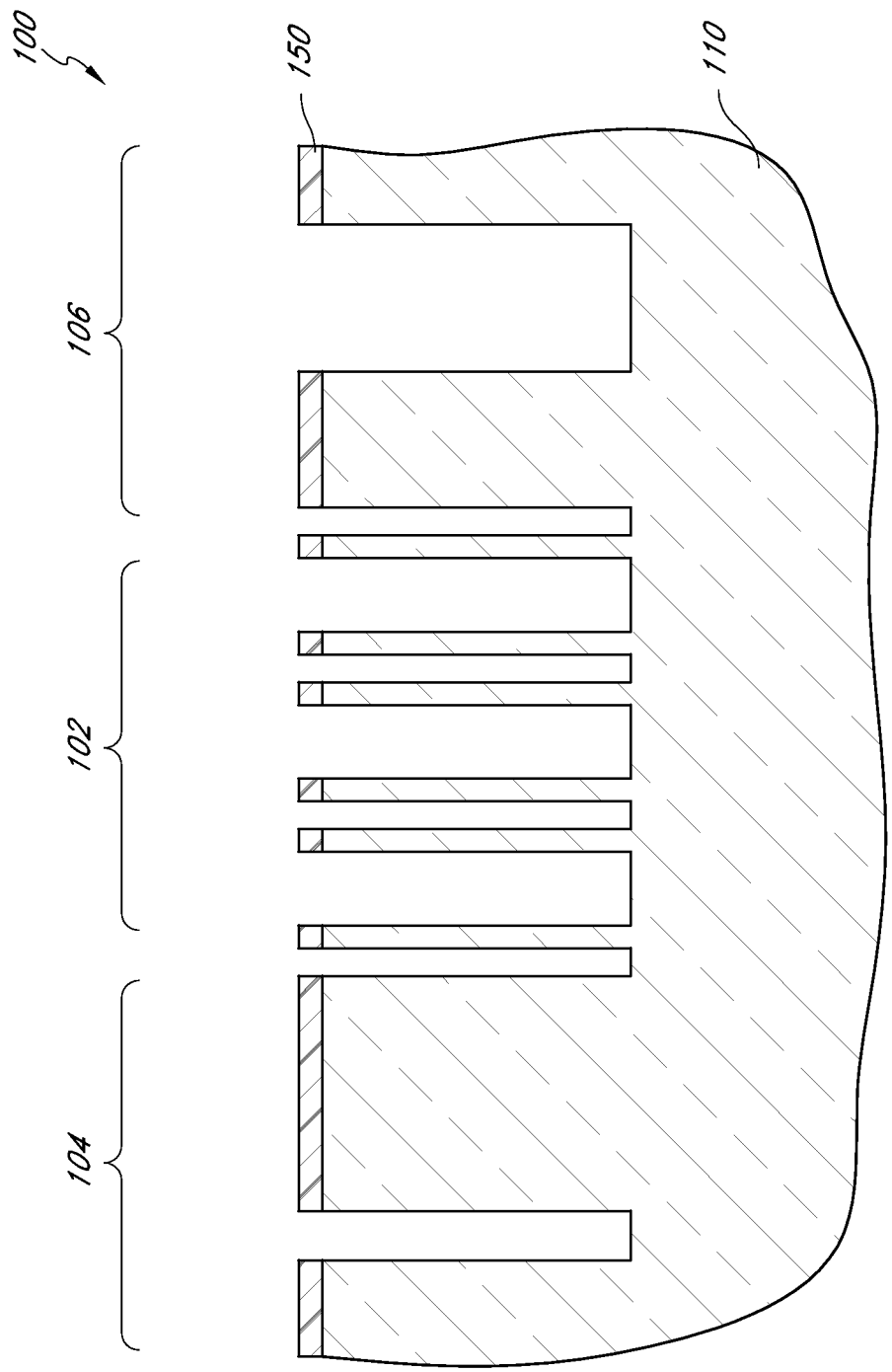
FIG. 13 is a schematic, cross-sectional side view of the partially formed integrated circuit of FIG. 12 after removing mask elements overlying the substrate, in accordance with other preferred embodiments of the invention.
Figure 14:
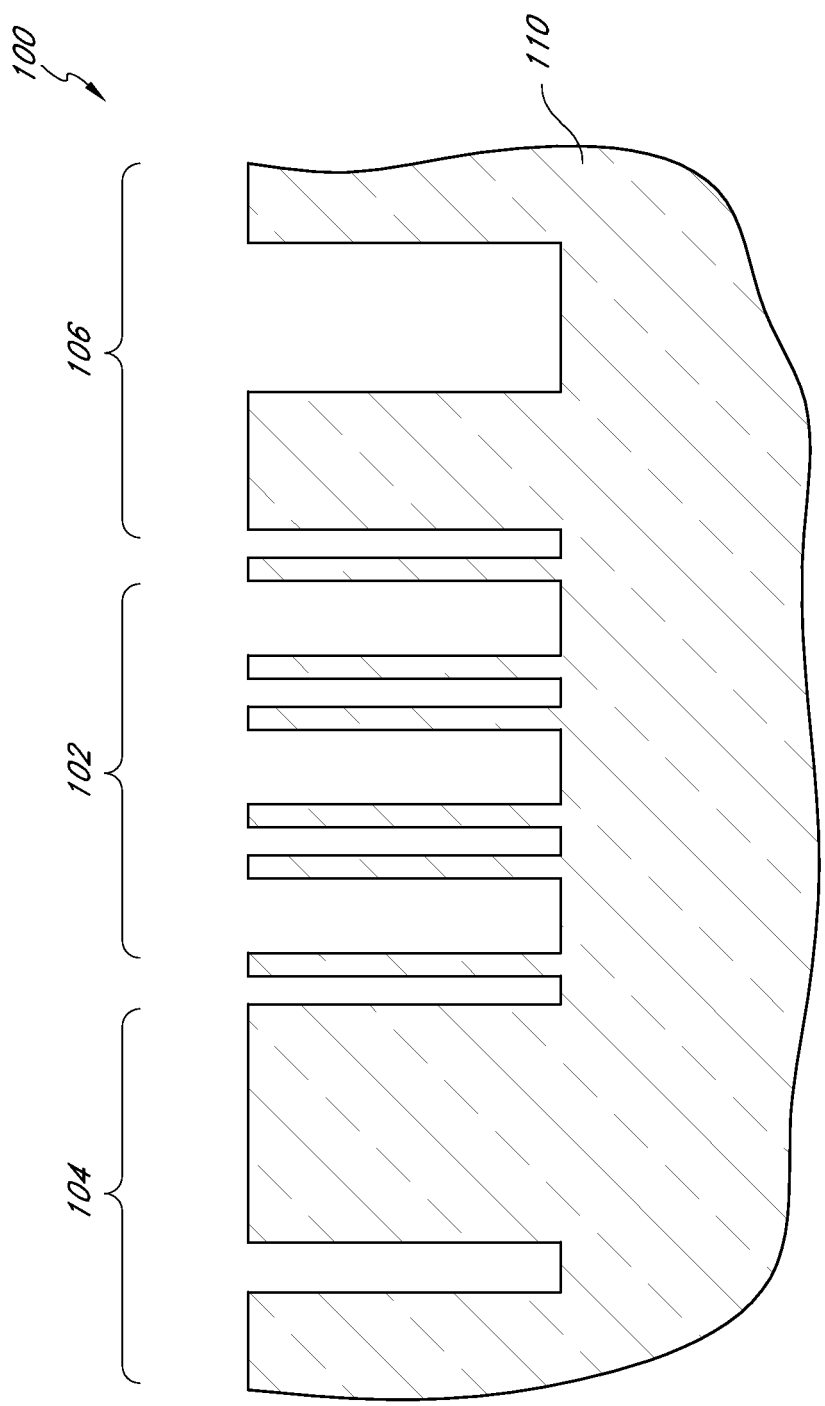
FIG. 14 is a schematic, cross-sectional side view of the partially formed integrated circuit of FIG. 12 or 13 after removing all mask elements overlying the substrate, in accordance with other preferred embodiments of the invention.

The substrate can subsequently be processed through the mask defined in the second hard mask layer 150. For example, with reference to FIG. 12, the pattern can be transferred to the substrate 110. With reference to FIG. 13, it will be appreciated that, where the substrate 110 is etched, etching of the substrate 110 can remove the spacers 165 and the remaining parts of the layers 130, 140. Thus, the second hard mask layer 150 is used as the primary mask for etching the substrate 110. In other embodiments, the spacers 165 and the remaining parts of the layers 130, 140 can be removed before or after processing of the substrate 110. With reference to FIG. 14, the hard mask layer 150 can be removed after processing the substrate 110.

Preferably, the substrate 110 is etched using an anisotropic etch selective for the substrate 110 relative to at least the second hard mask layer 150. It will be appreciated that where the substrate 110 comprises different materials, e.g., layers of different materials, a succession of different chemistries, preferably dry-etch chemistries, can be used to successively etch through these different materials, if a single chemistry is not sufficient to etch all the different materials. The composition of the substrate 110 can depend upon, e.g., the electrical device to be formed.

It will be appreciated that the pattern formed by the spacers 165 and then transferred to the second hard mask layer 150 and the substrate 110 can define lines, e.g., interconnects for connecting electrical devices. Preferably, the electrical devices are arranged in an array, such as the electrical devices which form memory cells in the array region of a memory device. The connections 172 (FIG. 9B) can advantageously define connections between larger features in the interface or periphery areas of an integrated circuit and pitch multiplied features, such as defined by the element 171, in the array. After the lines are formed, the partially fabricated integrated circuit 100 can be subjected to subsequent processing steps, including forming ancillary electrical devices and electrical interconnects, to form a completed integrated circuit, e.g., a memory chip.

It will be appreciated that various modifications of the illustrated embodiments are possible. For example, pitch multiplied patterns typically include closed loops, which are formed by spacers that are formed along the wall of a mandrel. Consequently, in non-damascene processes, where the spacers 165, rather the space between the spacers 165, are used to form conductive lines, additional processing steps are preferably used to cut off the ends of these loops, so that each loop forms two individual, non-connected lines. This can be accomplished, for example, by forming a protective mask around the parts of the lines to be maintained, while etching away the unprotected ends of the masks. A suitable method for cutting off the ends of the loops is disclosed in U.S. patent application Ser. No. 10/931,771 to Tran et al., filed Aug. 31, 2004, the entire disclosure of which is incorporated be reference herein. Advantageously, however, by using the spacers 165 to define the location of insulating material, rather than conductive material, the step of cutting off the ends of the spacer loops can be avoided. For example, it is unnecessary to cut off the ends of spacers loops where the spaces, e.g., the spaces formerly occupied by the mandrels, between the spacers 165 determine the location and shape of interconnects.

Also, in some cases, the spacers 165 can be removed before processing the substrate 110. Such removal may be beneficial, for example, where the spacers 165 are relatively tall and thin. Such spacers may not be structurally stable and may deform over the course of an etch of the 110 substrate, thereby introducing errors in the pattern etched into the substrate. As a result, removal of the spacers 165 and any remaining parts of the hard mask layer 130 or temporary layer 140 may advantageously stabilize the mask (defined in this example by the lower hard mask layer 150) through which the substrate 110 is processed.

In addition, the pitch of the spacers 165 can be more than doubled. For example, the spacers 165 can be further pitch multiplied by removing the mandrels 134a, forming additional spacers around the spacers 165, removing the spacers 165, then forming another set of spacers around the spacers that were formerly around the spacers 165, and so on. An exemplary method for further pitch multiplication is discussed in U.S. Pat. No. 5,328,810 to Lowrey et al.

Moreover, the preferred embodiments can be employed multiple times throughout an integrated circuit fabrication process to form pitch multiplied features in a plurality of layers or vertical levels, which may be vertically contiguous or non-contiguous and/or vertically separated. In such cases, each of the individual levels to be patterned would constitute a substrate 110 and the various layers 120-170 can formed over the individual level to be patterned. It will also be appreciated that the particular composition and height of the various layers 120-170 discussed above can be varied depending upon a particular application. For example, the thickness of the layer 150 can be varied depending upon the identity of the substrate 110, e.g., the chemical composition of the substrate, whether the substrate comprises single or multiple layers of material, the depth of features to be formed, etc., and the available etch chemistries. In some cases, one or more layers of the layer 120-170 can be omitted or more layers can be added. For example, in some cases, the pattern formed in the second hard mask layer 150 can be transferred to one or more additional hard mask layers, to provide a hard mask with increased resistance to etches selective for the substrate 110.

Also, while "processing" through a mask layer preferably involves etching underlying material, processing through the mask layers can involve subjecting layers underlying the mask layers to any semiconductor fabrication process. For example, processing can involve ion implantation, diffusion doping, depositing, oxidizing (particularly with use of a hard mask under the polymer mask), nitridizing, etc. through the mask layers and onto underlying layers. In addition, the mask layers can be used as a stop or barrier for chemical mechanical polishing (CMP) or CMP can be performed on any of the layers to allow for both planarization and etching of the underlying layers, as discussed in U.S. patent application Ser. No. 11/216,477, filed Aug. 31, 2005, the entire disclosure of which is incorporated by reference herein.

It will be appreciated from the description herein that the invention includes various aspects. For example, according to one aspect of the invention, a method is provided for integrated circuit fabrication. The method comprises patterning a first photoresist layer to form a photoresist pattern over a substrate. The photoresist pattern is transferred to a hardmask layer underlying the photoresist layer and a temporary layer underlying the hardmask layer. Spacers are formed on sidewalls of elements in the patterned hardmask and temporary layers. A second photoresist layer is deposited over the spacers and the patterned hardmask and temporary layers. The second photoresist layer is patterned to expose some parts of the patterned hardmask and temporary layers and to expose some of the spacers, while leaving photoresist directly over other parts of the patterned hardmask and temporary layers and over others of the spacers. The exposed parts of the patterned hardmask and temporary layers are subsequently preferentially removed. The second photoresist layer is preferentially removed.

According to another aspect of the invention, a method is provided for forming an integrated circuit. The method comprises patterning a selectively definable layer to simultaneously define array mask elements in an array region and periphery mask elements in a periphery region of a partially fabricated integrated circuit. Pitch multiplication is subsequently performed in the array region to form a plurality of free-standing spacers. A pattern defined at least partly by the free-standing spacers and the periphery mask elements are simultaneously transferred to a substrate.

According to yet another aspect of the invention, a method is provided for fabricating an integrated circuit. The method comprises providing a substrate with an overlying photoresist layer. The photoresist layer is patterned using a photolithographic technique, thereby forming a photoresist pattern comprising photoresist material separated by voids. The photoresist material and voids extend over an array region and a periphery region of the integrated circuit. The photoresist pattern is transferred to an underlying temporary layer to form a temporary layer pattern. The elements in the temporary layer pattern are subsequently shrunk in both the array and the periphery regions. A blanket layer of spacer material is deposited over the temporary layer elements. The blanket layer is etched to form spacers at sides of the temporary layer elements.

According to another aspect of the invention, a partially fabricated integrated circuit is provided. The partially fabricated integrated circuit comprises a plurality of mask elements overlying a hard mask layer. The hard mask layer overlies a substrate. Spacers are disposed on sidewalls of the mask elements. A protective layer directly overlies some of the spacers and some of the mask elements. The protective layer also leaves others of the spacers and others of the mask elements exposed.

According to yet another aspect of the invention, a partially formed integrated circuit is provided. The partially formed integrated circuit comprises a plurality of pairs of spacers over a substrate. Spacers constituting each pair of spacers are separated by a selectively etchable material. A patterned photoresist layer overlies some of the pairs of spacers. Photoresist overlies at least some spacers in a periphery or interface region of the partially fabricated integrated circuit, while spacers in an array region of the partially fabricated integrated circuit are exposed.

According to another aspect of the invention, a partially formed integrated circuit is provided. The partially formed integrated circuit comprises a plurality of pairs of free-standing spacers disposed over an array region of the partially fabricated integrated circuit. An other plurality of other pairs of spacers is disposed on the same level as the plurality of pairs of spacers. Spacers constituting each of the other pairs of spacers are disposed on sidewalls of a temporary material selectively etchable relative to the other pairs of spacers. The temporary material is provided with one or more openings.

In addition to the above disclosure, it will also be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. An integrated circuit, comprising:
   a plurality of pairs of spacers over a substrate, wherein spacers constituting each pair of spacers are separated by a material selectively etchable relative to the spacers; and
   a patterned photoresist overlying some of the pairs of spacers, wherein photoresist overlies at least some spacers in a periphery or interface region of the integrated circuit while exposing portions of the selectively etchable material in the periphery or interface region, and wherein spacers and material separating the spacers in an array region of the integrated circuit are exposed.

2. The integrated circuit of claim 1, wherein the selectively etchable material underlies a hard mask, the hard mask disposed between each pair of spacers.

3. The integrated circuit of claim 2, wherein portions of the hard mask are exposed through openings in the photoresist in a periphery area of the integrated circuit.

4. The integrated circuit of claim 2, wherein the photoresist directly contacts at least some of the spacers and hard mask.

5. The integrated circuit of claim 1, wherein a separation between pairs of spacers in the periphery region is greater than a separation between pairs of spacers in the array region.

6. The integrated circuit of claim 1, wherein at least some of the pairs of spacers define loops.

7. The integrated circuit of claim 1, further comprising a hard mask disposed between the substrate and spacers.

8. The integrated circuit of claim 1, wherein the spacers are formed from a material selected from the group consisting of silicon, silicon nitride, and silicon oxide.

9. The integrated circuit of claim 1, wherein the selectively etchable material is a carbon-containing material.

10. The integrated circuit of claim 9, wherein the carbon-containing material is amorphous carbon.

11. The integrated circuit of claim 1, wherein the plurality of pairs of spacers correspond to features of a memory array.

12. An integrated circuit, comprising:
   a plurality of mask elements overlying a hard mask, the hard mask overlying a substrate;
   spacers disposed on sidewalls of the mask elements; and
   a protective layer directly overlying some of the spacers and some of the mask elements, the protective layer leaving at least some others of the spacers and at least some others of the mask elements exposed,
   wherein the protective layer comprises openings exposing portions of some of the mask elements while spacers on sidewalls of at least some of the mask elements with exposed portions are covered by the protective layer, wherein sidewalls of the openings are disposed laterally between opposing sidewalls of the mask elements.

13. The integrated circuit of claim 12, wherein the protective layer leaves spacers in an array region of the integrated circuit exposed.

14. The integrated circuit of claim 13, wherein some surfaces of the mask elements in a periphery region of the integrated circuit are exposed.

15. The integrated circuit of claim 12, wherein the mask elements are disposed in an array and a periphery region of the integrated circuit.

16. The integrated circuit of claim 12, wherein the mask elements comprise a hard mask overlying a temporary layer, wherein the hard mask and the temporary layer are selectively etchable relative to the spacers.

17. The integrated circuit of claim 12, wherein the mask elements are formed of amorphous carbon.

18. The integrated circuit of claim 17, wherein the hard mask is formed of a material selected from the group consisting of silicon oxide, silicon or a dielectric anti-reflective coating.

19. The integrated circuit of claim 12, wherein the protective layer comprises an organic material.

20. The integrated circuit of claim 12, wherein the organic material is photoresist.

* * * * *